United States Patent
Li et al.

(10) Patent No.: US 11,695,393 B2
(45) Date of Patent: Jul. 4, 2023

(54) TRUE SINGLE PHASE CLOCK (TSPC) BASED LATCH ARRAY

(71) Applicant: QUALCOMM Incorporated, San Diego, CA (US)

(72) Inventors: Rui Li, San Diego, CA (US); De Lu, San Diego, CA (US); Venkat Narayanan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 303 days.

(21) Appl. No.: 17/162,647

(22) Filed: Jan. 29, 2021

(65) Prior Publication Data

US 2022/0247391 A1    Aug. 4, 2022

(51) Int. Cl.
*H03K 3/037* (2006.01)
*H03K 19/20* (2006.01)
*H04B 1/40* (2015.01)

(52) U.S. Cl.
CPC ............ *H03K 3/037* (2013.01); *H03K 19/20* (2013.01); *H04B 1/40* (2013.01)

(58) Field of Classification Search
CPC ...... H03K 3/037; H03K 3/0372; H03K 19/20; H04B 1/40
USPC ....... 327/199, 200, 201, 202, 203, 208, 210, 327/211, 212, 213, 214, 215, 218, 225; 365/189.05, 189.08
See application file for complete search history.

(56) References Cited

U.S. PATENT DOCUMENTS

| | | | | |
|---|---|---|---|---|
| 4,777,623 | A | * 10/1988 | Shimazu | H03K 3/35606 327/427 |
| 9,742,382 | B2 | * 8/2017 | Cai | H03K 3/35625 |
| 9,755,618 | B1 | * 9/2017 | Rasouli | H03K 3/356104 |
| 2018/0123571 | A1 | * 5/2018 | Savanth | H03K 19/20 |
| 2018/0152175 | A1 | 5/2018 | Lai et al. | |
| 2019/0173456 | A1 | 6/2019 | Guo et al. | |

OTHER PUBLICATIONS

Hsu S., et al., "A Microwatt-Class Always-On Sensor Fusion Engine Featuring Ultra-Low-Power AOI Clocked Circuits in 14nm CMOS," 2019 Symposium on VLSI Circuits Digest of Technical Papers, Jun. 2019, 2 pages.
International Search Report and Written Opinion—PCT/US2022/012108—ISA/EPO—dated May 9, 2022.

* cited by examiner

*Primary Examiner* — William Hernandez
(74) *Attorney, Agent, or Firm* — Loza & Loza, LLP

(57) ABSTRACT

A latch array including a row of master latches coupled to columns of slave latches. Each master latch includes an OR-AND-Inverter (OAI) gate cross-coupled with a NAND gate to receive and latch an input data, and each slave latch includes an AND-OR-Inverter (AOI) gate cross-coupled with a NOR gate to receive and latch the data from the master latch, and an inverter including an input coupled to the AOI gate and an output to produce an output data based on the input data. Alternatively, each master latch includes an AND-OR-Inverter (AOI) gate cross-coupled with a NOR gate to receive and latch an input data, and each slave latch includes an OR-AND-Inverter (OAI) gate cross-coupled with a NAND gate to receive and latch the data from the master latch, and an inverter including an input coupled to the OAI gate and an output to produce an output data.

26 Claims, 6 Drawing Sheets

TRUE SINGLE PHASE CLOCK (TSPC) BASED LATCH ARRAY

FIELD

Aspects of the present disclosure relate generally to memory devices, and in particular, to a true single phase clock (TSPC) based latch array.

BACKGROUND

An integrated circuit (IC), such as a system on chip (SOC), may include a memory device for storing data that has been processed and/or to be processed by one or more digital processing cores. In some cases, the memory device is configured as a static random-access memory (SRAM) device. However, for reduced power consumption, a latch array may be more suitable than an SRAM device.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a first latch including an OR-AND-Inverter (OAI) gate including: an OR gate including a first input configured to receive a first clock, and a second input configured to receive an input data, and a first NAND gate including a first input coupled to an output of the OR gate; and a second NAND gate including a first input configured to receive the first clock, a second input coupled to an output of the first NAND gate, and an output coupled to a second input of the first NAND gate.

Another aspect of the disclosure relates to an apparatus. The apparatus includes a latch including an AND-OR-Inverter (AOI) gate including: an AND gate including a first input configured to receive an input data, and a second input configured to receive a clock, and a first NOR gate including a first input coupled to an output of the AND gate; and a second NOR gate including a first input configured to receive the clock, a second input coupled to an output of the first NOR gate, and an output coupled to a second input of the first NOR gate.

Another aspect of the disclosure relates to a method. The method includes operating a first latch in a transparent mode by enabling an OR-AND-Inverter (OAI) gate to receive data and apply an inverted data to an input of a NAND gate cross-coupled with the OAI gate in response to a first edge of a first clock; and operating the first latch in an opaque mode by disabling an OR portion of the OAI gate and allowing the cross-coupled OAI gate and NAND gate to latch the data in response to a second edge of the first clock.

Another aspect of the disclosure relates to a wireless communication device. The wireless communication devices includes at least one antenna configured to wirelessly receive a radio frequency (RF) receive signal and wirelessly transmit an RF transmit signal; a transceiver configured to: convert the RF receive signal into a baseband receive signal, and convert a baseband transmit signal into the RF transmit signal; one or more digital signal processing cores configured to: process the baseband receive signal to generate first data, and generate the baseband transmit signal based on second data; and a latch array configured to store the first and second data. The latch array includes at least a first latch including: an OR-AND-Inverter (OAI) gate including: an OR gate including a first input configured to receive a first clock, and a second input configured to receive the first and second data; and a first NAND gate including a first input coupled to an output of the OR gate; and a second NAND gate including a first input configured to receive the first clock, a second input coupled to an output of the first NAND gate, and an output coupled to a second input of the first NAND gate.

Another aspect of the disclosure relates to a method. The method includes operating a first latch in a transparent mode by enabling an AND-OR-Inverter (AOI) gate to receive data and apply an inverted data to an input of a NOR gate cross-coupled with the AOI gate in response to a first edge of a first clock; and operating the first latch in an opaque mode by disabling an AND portion of the AOI gate and allowing the cross-coupled AOI gate and NOR gate to latch the data in response to a second edge of the first clock.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
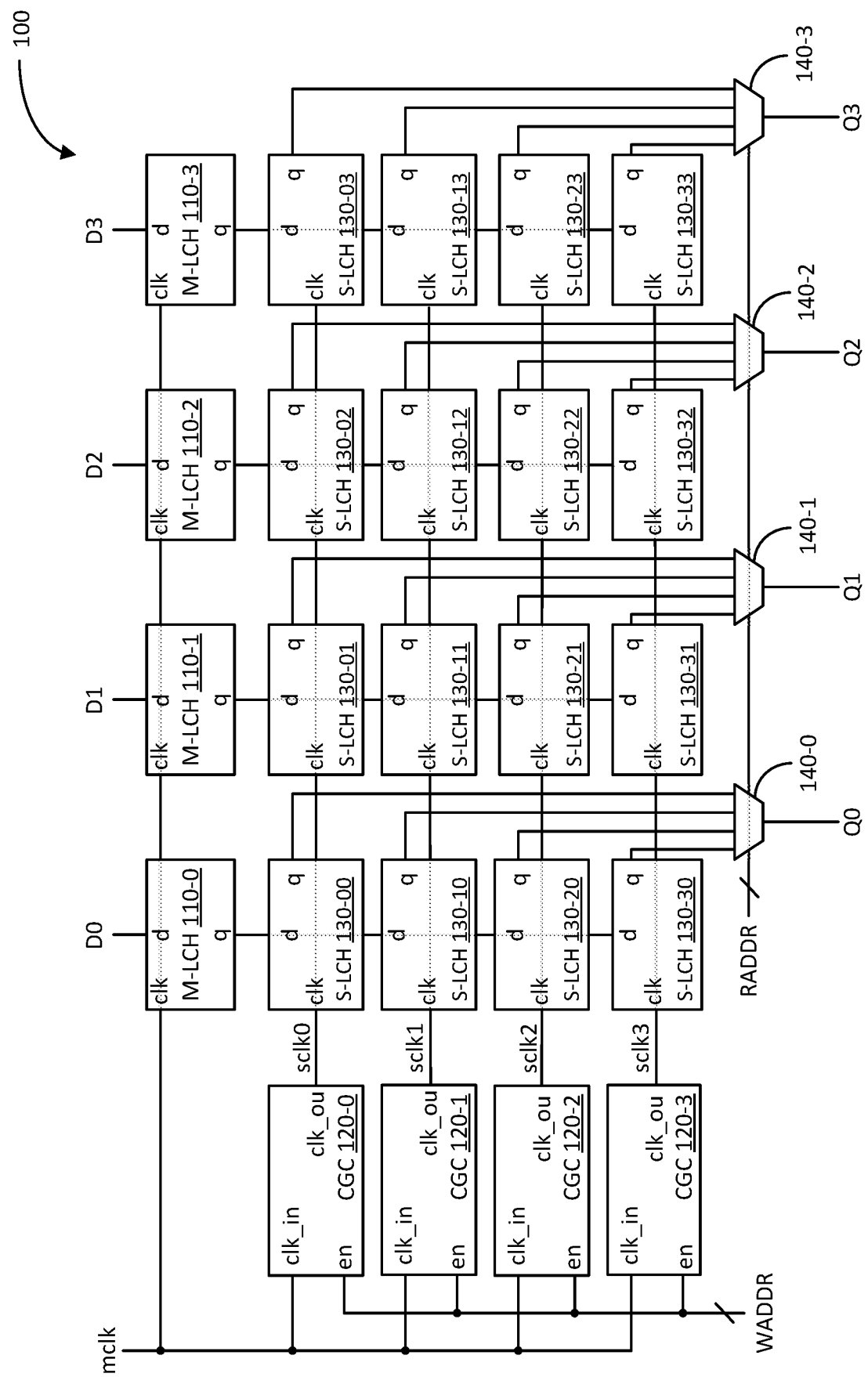
FIG. 1 illustrates a block diagram of an example latch array in accordance with an aspect of the disclosure.

FIG. 1 illustrates a block diagram of an example latch array 100 in accordance with an aspect of the disclosure. A latch array 100 is a memory device for storing data or bits using an array of latches or flip-flops. In some cases, the memory array may be used instead of a static random-access memory (SRAM) device because it may have a 5 to 10 times power advantage over an SRAM device. That is, for a given amount of storage capacity, the latch array 100 consumes a factor of 5 to 10 less power than an SRAM memory device. The latch array 100 may use a smaller supply voltage compared to that used in an SRAM device (e.g., 0.57 Volt (V) or lower for a latch array versus 0.75V for an SRAM device). The latch array 100 may be configured for faster access/write pulse as compared to an SRAM device. The latch array 100 may be more easily configurable for design for testing (DFT) coverage, and may be configured denser than an SRAM device.

The latch array 100 includes: a set of master latches (M-LCH) 110-0 to 110-3 (e.g., four (4), but could be any other number depending on the desired size of the array); a set of clock gating circuits (CGCs) 120-0 to 120-3 (e.g., four (4), but could be any other number depending on the desired size of the array); an array of slave latches 130-00 to 130-33 (e.g., a four (4) by four (4) array, but could be any other desired array dimension); and a set of multiplexers 140-0 to 140-3 (e.g., four (4), but could be any other number depending on the desired size of the array).

The set of master latches 110-0 to 110-3 includes: a set of clock inputs (clk) configured to receive a master clock signal mclk (referred to herein as a master clock mclk); a set of data inputs (d) configured to receive data D0 to D3 to be stored in the latch array 100; and a set of data outputs (q). A clock is a substantially periodic timing signal, such as a generally square-wave, whose rising and falling edges control the operations of the flip-flops described herein. The set of clock gate circuits (CGCs) 120-0 to 120-3 includes: a set of clock inputs (clk_in) configured to receive the master clock mclk; a set of enable inputs (en) configured to receive a write address signal (WADDR); and a set of clock outputs (clk_ou) configured to generate a set of slave clock signals sclk0 to sclk3 (referred to herein as slave clocks sclk0 to sclk3), respectively.

A first row of the array of slave latches 130-00 to 130-03 includes: a set of clock inputs (clk) coupled to the clock output (clk_ou) of the clock gating circuit (CGC) 120-0; a set of data inputs (d) coupled to the data outputs (q) of the set of master latches 110-0 to 110-3, respectively; and a set of data outputs (q). A second row of the array of slave latches 130-10 to 130-13 includes: a set of clock inputs (clk) coupled to the clock output (clk_ou) of the clock gating circuit (CGC) 120-1; a set of data inputs (d) coupled to the data outputs (q) of the set of master latches 110-0 to 110-3, respectively; and a set of data outputs (q).

A third row of the array of slave latches 130-20 to 130-23 includes: a set of clock inputs (clk) coupled to the clock output (clk_ou) of the clock gating circuit (CGC) 120-2; a set of data inputs (d) coupled to the data outputs (q) of the set of master latches 110-0 to 110-3, respectively; and a set of data outputs (q). A fourth row of the array of slave latches 130-30 to 130-33 includes: a set of clock inputs (clk) coupled to the clock output (clk_ou) of the clock gating circuit (CGC) 120-3; a set of data inputs (d) coupled to the data outputs (q) of the set of master latches 110-0 to 110-3, respectively; and a set of data outputs (q).

The set of multiplexers 140-0 to 140-1 includes: a first set of inputs coupled to the set of data outputs (q) of the first row of slave latches 130-00 to 130-03, respectively; a second set of inputs coupled to the set of data outputs (q) of the second row of slave latches 130-10 to 130-13, respectively; a third set of inputs coupled to the set of data outputs (q) of the third row of slave latches 130-20 to 130-23, respectively; a fourth set of inputs coupled to the set of data outputs (q) of the fourth row of slave latches 130-30 to 130-33, respectively; and a set of select inputs configured to receive a read address signal (RADDR).

The data writing operation of the latch array 100 operates as follows: The write address signal (WADDR) selects one of the rows of slave latches to which data is to be written during a particular data writing interval. For example, the write address signal (WADDR) may select the first row of slave latches 130-00 to 130-03 to which a set of data D0 to D3 is to be written, respectively. In response to an edge (e.g., a falling edge) of the master clock mclk and the write address signal (WADDR) addressing the first row of slave latches 130-00 to 130-03, the clock gating circuit (CGC) 120-0 causes the slave clock sclk0 to also exhibit consecutive edges (e.g., consecutive falling and rising edges) that are substantially time aligned with or within an acceptable margin of the falling and rising edges of the master clock mclk, as discussed in more detail herein. As, in this example, the write address signal (WADDR) is addressing the first row of slave latches 130-00 to 130-03, the gate clocking circuits (CGCs) 120-1, 120-2, and 120-3 associated with the rows not addressed maintain the corresponding slave clocks sclk1-sclk3 at low logic levels. The slave clocks sclk1-sclk3 not being asserted (at low logic levels in some implementations, and high logic levels in other implementations) causes the unaddressed slave latches 130-10 to 130-13, 130-20 to 130-23, and 130-30 to 130-33 to be opaque to prevent corruption of data stored in these slave latches.

The falling edge of the master clock mclk causes the set of master latches 110-0 to 110-3 to become transparent to receive the data D0 to D3, respectively. The falling edge of the slave clock sclk0 causes the first row of slave latches 130-00 to 130-03 to stay opaque. The next consecutive rising edge of the master clock mclk causes the set of master latches 110-0 to 110-3 to opaque to hold the data D0 to D3 it received, respectively. The next consecutive rising edge of the slave clock sclk0 causes the first row of slave latches 130-00 to 130-03 to become transparent and receive the data D0 to D3 from the set of master latches 110-0 to 110-3, respectively. The next consecutive falling edge of the master clock mclk causes the set of master latches 110-0 to 110-3 to become transparent to receive new data D0 to D3, respectively. The next consecutive falling edge of the slave clock sclk0 causes the first row of slave latches 130-00 to 130-03 to become opaque, and hold/store the data D0 to D3 it received from the set of master latches 110-0 to 110-3, respectively. The writing operation works the same for the other rows of slave latches when they are addressed.

The data reading operation of the latch array 100 operates as follows: The read address signal (RADDR) selects one of the rows of slave latches from which data is to be read during a particular data reading interval. For example, the read address signal (RADDR) may select the first row of slave latches 130-00 to 130-03 from which data D0 to D3 is to be read, respectively. In response, the set of multiplexers 140-0 to 140-3 selects the first set of inputs to route the data D0 to D3 from the set of outputs (q) of the first row of slave latches 130-00 to 130-03 to generate the set of outputs Q0 to Q3, respectively. The reading operation works the same for the other rows of slave latches when they are addressed.

Figure 2:
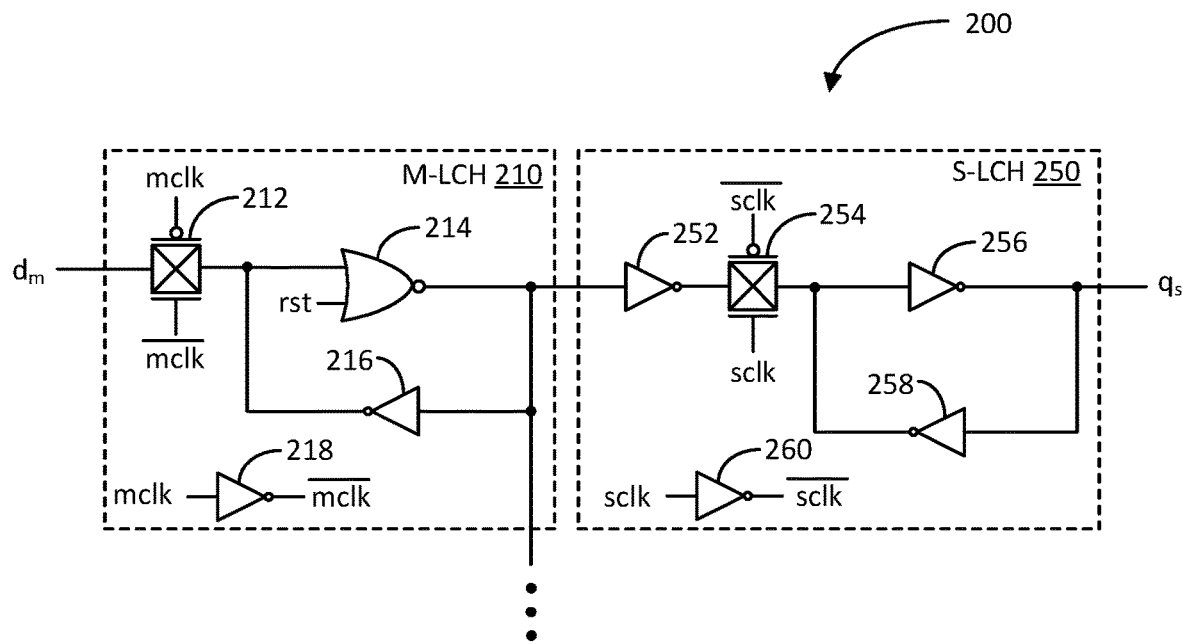
FIG. 2 illustrates a schematic diagram of an example transmission-gate-based flip-flop in accordance with another aspect of the disclosure.

FIG. 2 illustrates a schematic diagram of an example flip-flop 200 in accordance with another aspect of the disclosure. As discussed in more detail herein, the flip-flop 200 may be a transmission-gate-based flip-flop. The flip-flop 200 includes a master latch (M-LCH) 210 and a set of slave latches, one specifically illustrated as slave latch (S-LCH) 250. The master latch 210 may correspond to one of the set of master latches 110-0 to 110-3 previously discussed. The slave latch (S-LCH) 250 may correspond to one of the slave latches coupled to the master latch 210. As a specific example, the master latch 210 may correspond to master latch 110-0, and the slave latch 250 may correspond to slave latch 130-00.

The master latch 210 includes a transmission gate 212, a NOR gate 214, a first inverter 216, and a second inverter 218. The transmission gate 212 includes an input configured to receive an input data $d_m$. The transmission gate 212 includes a complementary control input configured to receive the master clock $\overline{mclk}$, and a non-complementary control input configured to receive a complementary master clock mclk. The transmission gate 212 includes an output coupled to a first input of the NOR gate 214. The NOR gate 214 includes a second input configured to receive a reset signal (rst). The NOR gate 214 includes an output coupled to an input of the first inverter 216. The first inverter 216 includes an output coupled to the first input of the NOR gate 214. The second inverter 218 includes an input configured to receive the master clock mclk, and an output configured to generate the complementary master clock $\overline{mclk}$ for the transmission gate 212.

The slave latch 250 includes a first inverter 252, a transmission gate 254, and second, third, and fourth inverters 256, 258, and 260. The first inverter 252 includes an input coupled to an output of the NOR gate 214 of the master latch 210, and an output coupled to an input of the transmission gate 254. The transmission gate 254 includes a non-complementary control input configured to receive the corresponding slave clock sclk, and a complementary control input configured to receive the corresponding complementary slave clock $\overline{sclk}$. The transmission gate 254 includes an output coupled to an input of the second inverter 256. The second inverter 256 includes an output coupled to an input of the third inverter 258. The third inverter 258 includes an output coupled to the input of the second inverter 256. The fourth inverter 260 includes an input configured to receive the slave clock sclk, and an output to generate the complementary slave clock $\overline{sclk}$ for the transmission gate 254. As indicated by the ellipsis, the output of the master latch 210 (e.g., the output of the NOR gate 214) is coupled to the data input of the other slave latches in the same column as slave latch 250.

In operation, when a substantially simultaneous falling edges occur in the master clock mclk and the slave clock sclk, the transmission gate 212 of the master latch 210 is transparent, and the transmission gate of the 254 of the slave latch 250 is opaque. Thus, the data $d_m$ at the input of the master latch 210 propagates to the first input of the NOR gate 214 via the transmission gate 212. However, the data $d_m$ does not propagate to the input of the second inverter 256 of the slave latch 250 as the transmission gate 254 is opaque.

The second and third inverters 256 and 258 are cross-coupled; and thus, latch the previous data $d_{m-1}$ as its output data $q_s$.

When the next substantially simultaneous rising edges occur in the master clock mclk and the slave clock sclk, the transmission gate 212 of the master latch 210 is opaque, and the transmission gate of the 254 of the slave latch 250 is transparent. If the reset signal (rst) is not asserted (e.g., a logic low), the NOR gate 214 and first inverter 216 of the master latch 210 form cross-coupled inverters to latch the data $d_m$. The transmission gate 212 being opaque prevents the next data $d_{m+1}$ (or noise at the input of the master latch 210) from corrupting the data $d_m$ latched by the cross-coupled NOR gate 214 and inverter 216. The transmission gate 254 being transparent allows the data $d_m$ to pass to the input of the second inverter 256 via the first inverter 252 and the transmission gate 254.

When the next consecutive simultaneous falling edges occur in the master clock mclk and the slave clock sclk, the transmission gate 212 of the master latch 210 becomes transparent again, and the transmission gate 254 of the slave latch 250 becomes opaque again. Thus, the new data $d_{m+1}$ at the input of the master latch 210 propagates to the first input of the NOR gate 214 via the transmission gate 212, but not to the second inverter 256 as transmission gate 254 is opaque. The second and third inverters 256 and 258 are cross coupled; and thus, latch the data $d_m$ as its output data $q_s$. The process repeats to receive and store new data by the flip-flop 200.

There are several drawbacks with the transmission-gate-based flip-flop 200. First, the flip-flop 200 requires non-complementary and complementary clocks mclk/$\overline{mclk}$ and sclk/$\overline{sclk}$, and the inverters 218 and 260 to generate these clocks. Further, the transmission gates 212 and 254 are also driven by the master and slave clocks, respectively. Thus, the flip-flop 200 consumes significant amount of clock power. Second, the flip-flop 200 requires a significant amount of clock transistors, such as 12 clock transistors (e.g., eight (8) for the transmission gates 212 and 254, and four (4) for the inverters 218 and 260). Thus, for at least power efficiency sake, another type of master-gate flip-flop may be more suitable.

Figure 3:
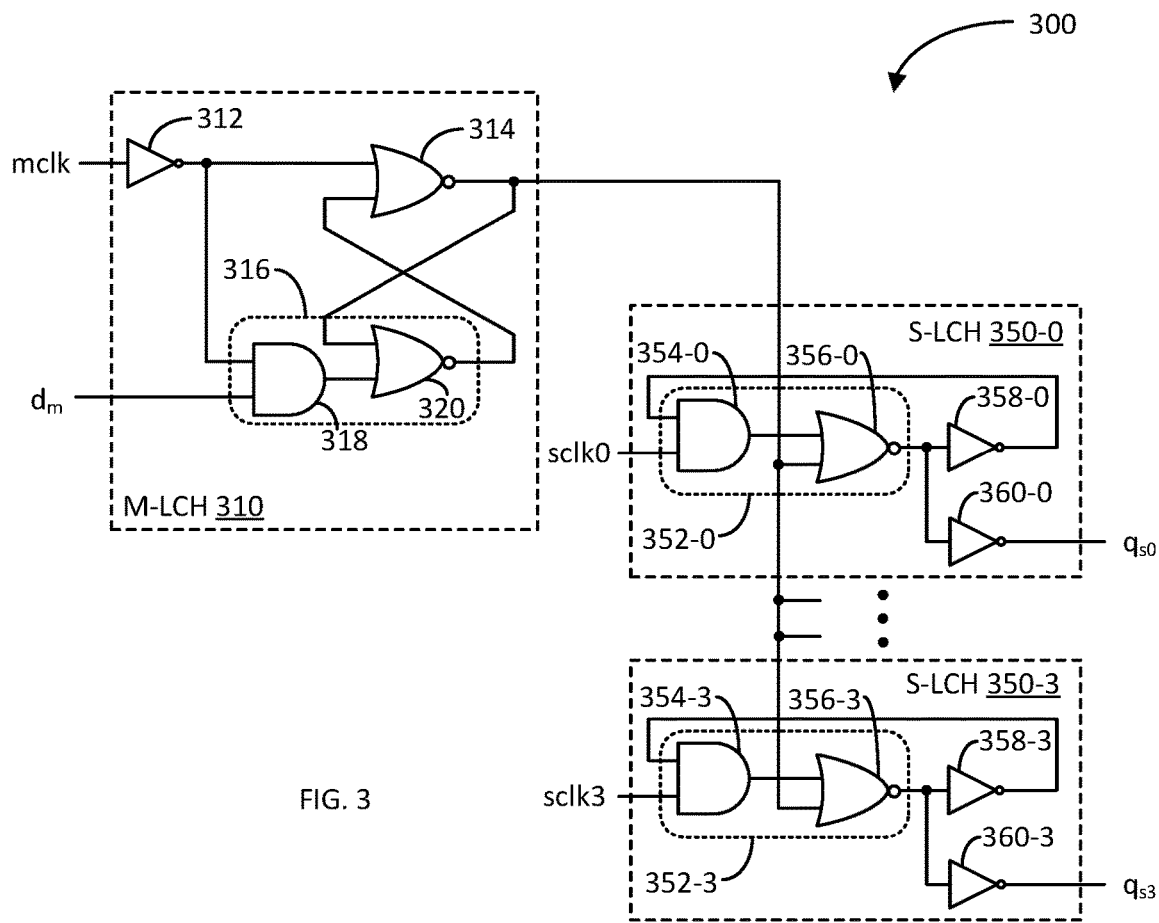
FIG. 3 illustrates a schematic diagram of an example true single phase clock (TSPC) flip-flop in accordance with another aspect of the disclosure.

FIG. 3 illustrates a schematic diagram of an example true single phase clock (TSPC) flip-flop 300 in accordance with another aspect of the disclosure. As the name suggest, the TSPC flip-flop 300 does not require the generation of the complementary master clock $\overline{mclk}$ in a master latch nor the generation of the complementary slave clocks $\overline{sclk}$ in each of the slave latches. Because the TSPC flip-flop 300 does not require the generation of the complementary clocks, the TSPC flip-flop 300 generally consumes less clock power than the transmission-gate-based flip-flop 200. Furthermore, the TSPC flip-flop 300 requires less clock transistors (e.g., six (6)) compared to that of the transmission-gate-based flip-flop 200 (e.g., 12).

In particular, the TSPC flip-flop 300 includes a master latch 310 and a set of slave latches 350-0 to 350-3. The master latch 310 may correspond to any one of the master latches 110-0 to 110-3 of latch array 100. The set of slave latches 350-0 to 350-3 may correspond to a column of slave latches of the latch array 100 that are coupled to the master latch 310. For example, the master latch 310 may correspond to master latch 110-0 of latch array 100, and the set of slave latches 350-0 to 350-3 may correspond to slave latches 130-00 to 130-30, respectively.

The master latch 310 includes an inverter 312, a NOR gate 314, and an AND-OR-Inverter (AOI) gate 316 including an AND gate 318 and a NOR gate 320. The inverter 312 includes an input configured to receive the master clock mclk, and an output coupled to a first input of the NOR gate 314 and a first input of the AND gate 318 of the AOI gate 316. The AND gate 318 of the AOI gate 316 includes a second input configured to receive an input data $d_m$. The AND gate 318 includes an output coupled to a first input of the NOR gate 320 of the AOI gate 316. The NOR gate 314 includes an output coupled to a second input of the NOR gate 320 of the AOI gate 316. And, the NOR gate 320 of the AOI gate 316 includes an output coupled to a second input of the NOR gate 314.

The set of slave latches 350-0 to 350-3 are similarly configured. Taking slave latch 350-0 as an example, the slave latch 350-0 includes an AOI gate 352-0 including an AND gate 354-0 and a NOR gate 356-0, a first inverter 358-0, and a second inverter 360-0. The AND gate 354-0 of the AOI gate 352-0 includes a first input configured to receive a corresponding slave clock sclk0, and an output coupled to a first input of the NOR gate 356-0 of the AOI gate 352-0. The NOR gate 356-0 of the AOI gate 352-0 includes a second input coupled to an output of the NOR gate 314 of the master latch 310. The NOR gate 356-0 of the AOI gate 352-0 includes an output coupled to inputs of the first and second inverters 358-0 and 360-0, respectively. The first inverter 358-0 includes an output coupled to a second input of the AND gate 354-0 of the AOI gate 352-0. The second inverter 360-0 includes an output configured to generate an output data $q_{s0}$.

As mentioned, the other slave latches 350-1 to 350-3 of the set or column are configured similarly as that of slave latch 350-0, but are configured to receive instead the corresponding slave clocks sclk1 to sclk-3, respectively. For clarity, the slave latch 350-3 includes an AOI gate 352-3 including an AND gate 354-3 and a NOR gate 356-3, a first inverter 358-3, and a second inverter 360-3. The AND gate 354-3 of the AOI gate 352-3 includes a first input configured to receive a corresponding slave clock sclk3, and an output coupled to a first input of the NOR gate 356-3 of the AOI gate 352-3. The NOR gate 356-3 of the AOI gate 352-3 includes a second input coupled to the output of the NOR gate 314 of the master latch 310. The NOR gate 356-3 of the AOI gate 352-3 includes an output coupled to inputs of the first and second inverters 358-3 and 360-3, respectively. The first inverter 358-3 includes an output coupled to a second input of the AND gate 354-3 of the AOI gate 352-3. The second inverter 360-3 includes an output configured to generate an output data $q_{s3}$.

In operation, when the master clock mclk and the slave clock sclk0 exhibit substantially time-aligned falling and rising edges, the master latch 310 is transparent and the slave latch 350-0 is opaque, respectively. The inverter 312 inverts the low logic level of the master clock mclk to produce a high logic level at the first input of the AND gate 318 of the AOI gate 316. Accordingly, the data $d_m$ at the second input of the AND gate 318 is allowed to propagate to the first input of the NOR gate 320. The high logic level generated by the inverter 312 causes the NOR gate 314 to output a low logic level. Accordingly, the output of the NOR gate 320 of the AOI gate 316 generates an inverted input data $\overline{d_m}$. Thus, the master latch 310 has received the input data $d_m$ as it is in transparent mode.

The high logic level of the slave clock sclk0 enables the AND gate 354-0 of the AOI gate 352-0 so that the feedback of the previous data $d_{m-1}$ via the NOR gate 356-0 and first inverter 358-0 is active. Thus, the previous data $d_{m-1}$ from the master latch 310 is latched by the feedback network, and the second inverter 360-0 outputs the previous data $d_{m-1}$ as output data $q_{s0}$. As discussed, one of the slave clocks is asserted (e.g., a logic zero (0) in this example) at a given time, the other slave clocks sclk1 to sclk3 are logic ones (1s); thereby, setting the other slave latches 350-1 to 350-3 in the latched or opaque configuration.

When the master clock mclk and the slave clock sclk0 exhibit the next consecutive substantially time-aligned rising and falling edges, the master latch 310 becomes opaque and the slave latch 350-0 becomes transparent, respectively. The inverter 312 inverts the high logic level of the master clock mclk to produce a low logic level at the first input of the AND gate 318 of the AOI gate 316. Thus, the AND gate 318 is disabled to prevent a new data $d_{m+1}$ (or noise at the input) from corrupting the latching of the current data $d_m$ by the master latch 310. The low logic level generated by the inverter 312 enables the NOR gate 314 to latch the data $d_m$ via the cross-coupled NOR gates 314 and 320.

The low logic level of the slave clock sclk0 disables the AND gate 354-0 of the AOI gate 352-0 to disable the latch operation of the feedback network of the slave latch 350. The low logic level of the slave clock sclk0 via the AND gate 354-0 enables the NOR gate 356-0 to respond to the current latched data $d_m$ from the master latch 310; in other words, the slave latch 350-0 is transparent to receive the current data $d_m$ from the master latch 310. Thus, the NOR gate 356-0 outputs the inverted current data $\overline{d_m}$ and the first and second inverters 358-0 and 360-0 generate the current data $d_m$. The aforementioned process is repeated to receive and latch new data in response to rising and falling edges of the master clock mclk and the slave clock associated with the addressed row of slave latches.

A drawback of the TSPC flip-flop 300 is that the output of the NOR gate 314 logically toggles, and may corrupt the data latched by the unaddressed slave latches. For example, assume that the unaddressed slave latch 350-3 has latched a logic one (0), and the current data $d_m$ to be written to addressed slave latch 350-0 is a logic one (1). If the unaddressed slave latch 350-0 has latched a logic zero (0), the output of the NOR gate 356-3 is at a logic one (1). When the master clock mclk goes high to latch the logic one (1) of data $d_m$ at the output of the NOR gate 314, the NOR gate 356-3 of the unaddressed slave latch 350-3 responds to the logic one (1) because its second input is coupled to the output of the NOR gate 314 of the master latch 310. Thus, the NOR gate 314 changes its output to a logic zero (0); thereby, corrupting the latched data in the unaddressed slave latch 350-3.

Figure 4:
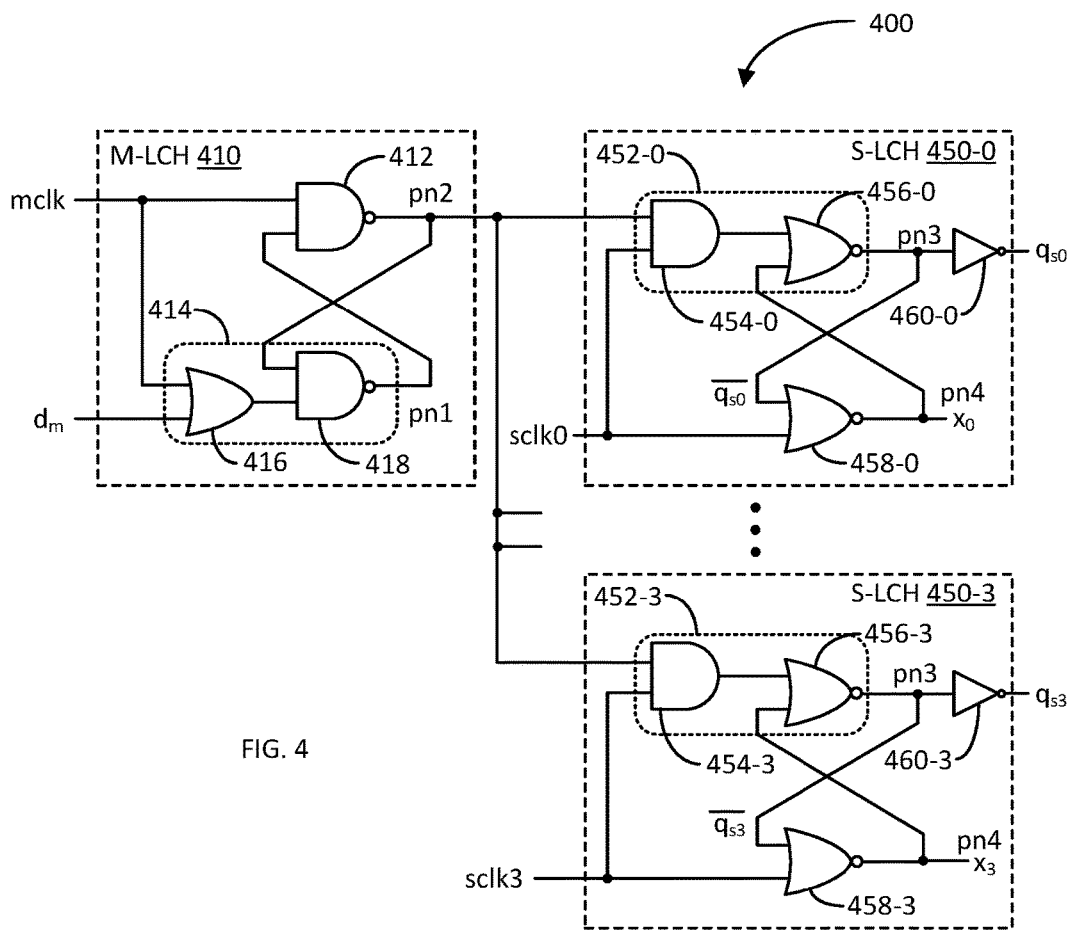
FIG. 4 illustrates a schematic diagram of another example true single phase clock (TSPC) flip-flop in accordance with another aspect of the disclosure.

FIG. 4 illustrates a schematic diagram of another example true single phase clock (TSPC) flip-flop 400 in accordance with another aspect of the disclosure. Again, as the name suggest, the TSPC flip-flop 400 does not require the generation of a complementary master clock $\overline{mclk}$ in a master latch nor the generation of a complementary slave clock $\overline{sclk}$ in each of the slave latches. Because the TSPC flip-flop 400 does not require the generation of the complementary clocks, the TSPC flip-flop 400 generally consumes less clock power than the transmission-gate-based flip-flop 200. Furthermore, the TSPC flip-flop 400 requires less clock transistors (e.g., eight (8)) compared to that of the transmission-gate-based flip-flop 200 (e.g., 12).

In particular, the TSPC flip-flop 400 includes a master latch 410 and a set of slave latches 450-0 to 450-3. The master latch 410 may correspond to any one of the master latches 110-0 to 110-3 of latch array 100. The set of slave latches 450-0 to 450-3 may correspond to a column of slave latches of the latch array 100 that are coupled to the master latch 410. For example, the master latch 410 may correspond to master latch 110-0 of the latch array 100, and the set of slave latches 450-0 to 450-3 may correspond to slave latches 130-00 to 130-30, respectively.

The master latch 410 includes a NAND gate 412 and a OR-AND-Inverter (OAI) gate 414 including an OR gate 416 and a NAND gate 418. The NAND gate 412 includes a first input configured to receive the master clock mclk, and an output (node pn2) coupled to a first input of the NAND gate 418 of the OAI gate 414. The OR gate 416 of the OAI gate 414 includes a first input configured to receive the master clock mclk, and a second input configured to receive an input data $d_m$. The OR gate 416 includes an output coupled to a second input of the NAND gate 418 of the OAI gate 414. The NAND gate 418 includes an output (node pn1) coupled to a second input of the NAND gate 412.

The set of slave latches 450-0 to 450-3 are similarly configured. Taking slave latch 450-0 as an example, the slave latch 450-0 includes an AND-OR-Inverter (AOI) gate 452-0 including an AND gate 454-0 and a NOR gate 456-0, a NOR gate 458-0, and an inverter 460-0. The AND gate 454-0 of the AOI gate 452-0 includes a first input coupled to an output (node pn2) of the NAND gate 412 of the master latch 410, a second input configured to receive a corresponding slave clock sclk0, and an output coupled to a first input of the NOR gate 456-0 of the AOI gate 452-0. The NOR gate 456-0 of the AOI gate 452-0 includes a second input coupled to an output (node pn4) of the NOR gate 458-0. The NOR gate 456-0 of the AOI gate 452-0 includes an output (node pn3) coupled to a first input of the NOR gate 458-0 and to an input of the inverter 460-0. The NOR gate 458-0 includes a second input configured to receive the corresponding slave clock sclk0. The output (node pn3) of the NOR gate 456-0 is configured to produce a complementary output data $\overline{q_{s0}}$, the output of the inverter 460-0 is configured to produce a non-complementary output data $q_{s0}$, and an output (node pn4) of the NOR gate 458-0 is configured to produce an internal signal $x_0$.

As mentioned, the other slave latches 450-1 to 450-3 of the set or column are configured similarly as that of slave latch 450-0, but are configured to receive instead the corresponding slave clocks sclk1 to sclk-3, respectively. For clarity, the slave latch 450-3 includes an AOI gate 452-3 including an AND gate 454-3 and a NOR gate 456-3, a NOR gate 458-3, and an inverter 460-3. The AND gate 454-3 of the AOI gate 452-3 includes a first input coupled to an output (node pn2) of the NAND gate 412 of the master latch 410, a second input configured to receive a corresponding slave clock sclk3, and an output coupled to a first input of the NOR gate 456-3 of the AOI gate 452-3. The NOR gate 456-3 of the AOI gate 452-3 includes a second input coupled to an output (node pn4) of the NOR gate 458-3. The NOR gate 456-3 of the AOI gate 452-3 includes an output (node pn3) coupled to a first input of the NOR gate 458-3 and to an input of the inverter 460-3. The NOR gate 458-3 includes a second input configured to receive the corresponding slave clock sclk3. The output (node pn3) of the NOR gate 456-3 is configured to produce a complementary output data $\overline{q_{s3}}$, the output of the inverter 460-3 is configured to produce a non-complementary output data $q_{s3}$, and an output (node pn4) of the NOR gate 458-3 is configured to produce an internal signal $x_3$.

The writing of data $d_m$ to the slave latch 450-0 may be as follows: When the master clock mclk and the slave clock sclk0 exhibit substantially time-aligned falling edges, the master latch 410 becomes transparent and the slave latch 450-0 becomes opaque. In response to the low logic level of the master clock mclk, the NAND gate 412 outputs a logic one (1) at node pn2. Also, in response to the low logic level of the master clock mclk, the OR gate 416 of the OAI gate 414 allows the data $d_m$ (albeit inverted) to propagate to the second input of the NAND gate 412 via the NAND gate 418. Thus, the master latch 410 is in transparent mode as it is able to receive the input data $d_m$.

With regard to the slave latch 450-0, the low logic level of the slave clock sclk0 disables the AND gate 454-0 of the AOI gate 452-0 to make the slave latch 450-0 opaque. Thus, the cross-coupled AOI gate 452-0 and NOR gate 458-0 maintain the previous inverted data $\overline{d_{m-1}}$ or $\overline{q_{s0}}$ latched. The inverter 460-0 inverts previous inverted data $\overline{d_{m-1}}$ or $\overline{q_{s0}}$ to generate the output data $q_{s0}$. By the same token, the unaddressed slave latches 450-1 to 450-3, in this example, also have their AND gates 454-1 to 454-3 disabled via low logic levels of the slave clocks sclk1 to sclk3, respectively. Thus, in contrast to the TSPC flip-flop 300, the toggling of the output (node pn2) of the NAND gate 412 of the master latch 410 does not corrupt the latching of the data in the unaddressed slave latches 450-1 to 450-3.

When the master clock mclk and the slave clock sclk0 exhibit the next consecutive substantially time-aligned rising edges, the master latch 410 becomes opaque and the slave latch 450-0 becomes transparent. In response to the high logic level of the master clock mclk, the NAND gate 412 is enabled; thereby, causing the cross-coupled NAND gates 412 and OAI gate 414 to latch the current data $d_m$. Also, in response to the high logic level of the master clock mclk, the OR gate 416 of the OAI gate 414 is disabled; thereby, preventing the new data $d_{m+1}$ (or noise at the input) from corrupting the latching of the current data $d_m$ by the cross-coupled NAND gate 412 and OAI gate 414. Thus, the master latch 410 is in opaque mode.

With regard to the slave latch 450-0, the high logic level of the slave clock sclk0 enables the AND gate 454-0 of the AOI gate 452-0. Thus, the current data $d_m$ (albeit inverted) propagates to the first input of the NOR gate 458-0 via the NOR gate 456-0. The high logic level of the slave clock sclk0 disables the NOR gate 458-0 causing it to generate the internal signal $x_0$ as a logic zero (0) at node pn4. Thus, the slave latch 450-0 is in transparent mode. With regard to the unaddressed slave latches 450-1 to 450-3, in this example, their AND gates 454-1 to 454-3 are disabled via low logic levels of the slave clocks sclk1 to sclk3, respectively. Thus, the logic value of the current data $d_m$ at the output (node pn2) of the NAND gate 412 of the master latch 410 does not affect the data latched by the unaddressed slave latches 450-1 to 450-3.

Figure 5:
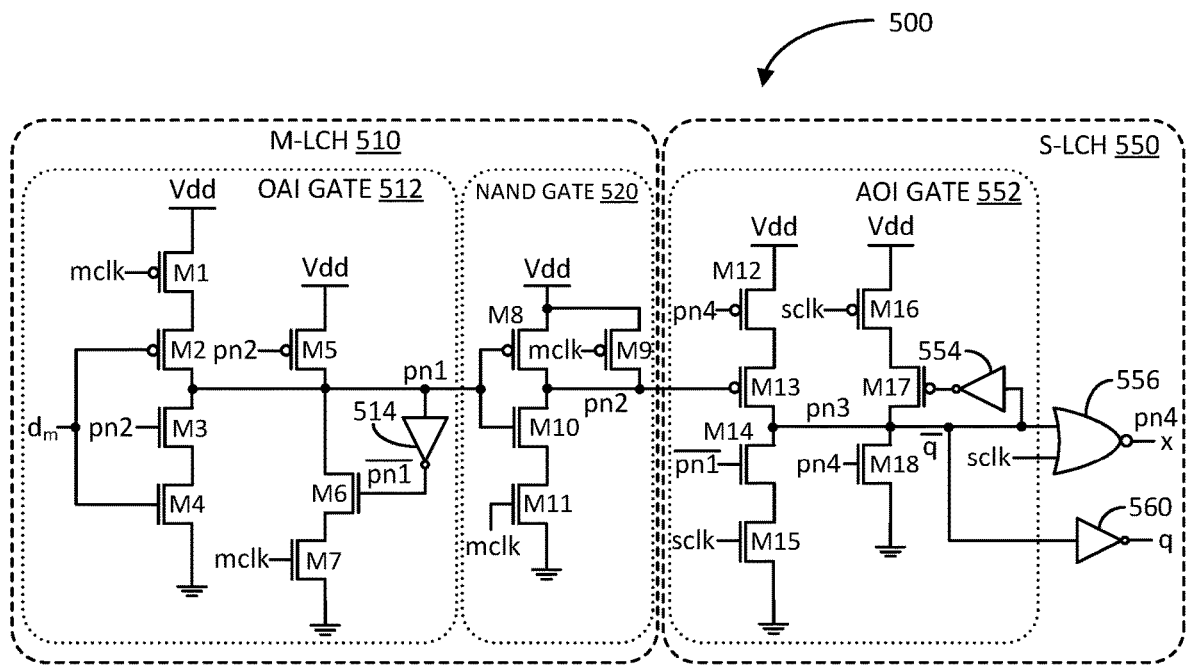
FIG. 5 illustrates a schematic diagram of another example true single phase clock (TSPC) flip-flop in accordance with another aspect of the disclosure.

FIG. 5 illustrates a schematic diagram of another example true single phase clock (TSPC) flip-flop 500 in accordance with another aspect of the disclosure. The TSPC 500 may be a more detailed (e.g., transistor-level) example implementation of the TSPC 400 previously discussed. The TSPC 500 includes a master latch (M-LCH) 510 and a slave latch (S-LCH) 550, which may correspond to master latch 410 and any one of the set of slave latches 450-0 to 450-3, respectively. The master latch 510 includes an OR-AND-Inverter (OAI) gate 512 cross-coupled with a NAND gate 520. The slave latch 550 includes an AND-OR-Inverter (AOI) gate 552 cross-coupled with a NOR gate 556, and an inverter 560.

The master latch 510 includes a first p-channel metal oxide semiconductor field effect transistor (PMOS FET) M1 and a second PMOS FET M2 coupled in series between an upper voltage rail Vdd and an output (node pn1) of the OAI gate 512. The master latch 510 further includes a first n-channel metal oxide semiconductor field effect transistor (NMOS FET) M3 and a second NMOS FET M4 coupled in series between the output (node pn1) of the OAI gate 512 and a lower voltage rail (e.g., ground). The PMOS FET M1 includes a gate configured to receive the master clock mclk, the PMOS FET M2 includes a gate configured to receive an input data $d_m$, the NMOS FET M3 includes a gate coupled to an output (node pn2) of the NAND gate 520, and the NMOS FET M4 includes a gate configured to receive the input data $d_m$.

The master latch 510 further includes PMOS FET M5, NMOS FET M6, NMOS FET M7, and inverter 514. The PMOS FET M5 is coupled between the upper voltage rail Vdd and the output (node pn1) of the OAI gate 512, and includes a gate coupled to the output (node pn2) of the NAND gate 520. The NMOS FETs M6 and M7 are coupled in series between the output (node pn1) of the OAI gate 512 and the lower voltage rail. The inverter 514 includes an input coupled to the output (node pn1) of the OAI gate 512 and an output coupled to a gate of NMOS FET M6. The NMOS FET M7 includes a gate configured to receive the master clock mclk. As discussed further herein, the circuitry including the inverter 514 and the NMOS FET M6 is to address a racing condition and a falling clock transparency (FCT) margin, as discussed in more detail further herein.

The NAND gate 520 further includes a PMOS FET M8 coupled in parallel with a PMOS FET M9 between the upper voltage rail Vdd and the output (node pn2) of the NAND gate 520, and NMOS FET M10 and NMOS FET M11 coupled in series between the output (node pn2) of the NAND gate 520 and the lower voltage rail. The PMOS FET M8 and NMOS FET M10 include gates coupled to output (node pn1) of the OAI gate 512, the PMOS FET M9 includes a gate configured to receive the master clock mclk, and the NMOS FET M11 includes a gate configured to receive the master clock mclk.

With regard to the slave latch 550, the AOI gate 552 includes a PMOS FET M12 and a PMOS FET M13 coupled in series between the upper voltage rail Vdd and an output (node pn3) of the AOI gate 552. The AOI gate 552 further includes an NMOS FET M14 and NMOS FET M15 coupled in series between the output (node pn3) of the AOI gate 552 and the lower voltage rail. The PMOS FET M12 includes a gate coupled to an output (node pn4) of a NOR gate 556 of the slave latch 550. The PMOS FET M13 includes a gate coupled to the output (node pn2) of the NAND gate 520 of the master latch 510. The NMOS FET M14 includes a gate coupled to the output of the inverter 514 of the master latch 510. And, the NMOS FET M15 includes a gate configured to receive the corresponding slave clock sclk.

The AOI gate 552 further includes a PMOS FET M16 coupled in series with a PMOS FET M17 between the upper voltage rail Vdd and the output (node pn3) of the AOI gate 552. Additionally, the AOI gate 552 includes an NMOS FET M18 coupled between the output (node pn3) of the AOI gate 552 and the lower voltage rail. Further, the AOI gate 552 includes an inverter 554 including an input coupled to the output (node pn3) of the AOI gate 552 and an output coupled to a gate of PMOS FET M17. The PMOS FET M16 includes a gate configured to receive the corresponding slave clock sclk. The NMOS FET M18 includes a gate coupled to the output (node pn4) of the NOR gate 556. Accordingly, the circuitry including the inverter 554 and the PMOS FET M17 is to address a racing condition as discussed further herein.

The NOR gate 556 of the slave latch 550 includes a first input coupled to the output (node pn3) of the AOI gate 552, a second input configured to receive the corresponding slave clock sclk, and the output (node pn4) to generate an internal signal x. The inverter 560 includes an input coupled to the output (node pn3) of the AOI gate 552, and an output configured to generate an output data q.

The writing of data $d_m$ to the slave latch 550 may be as follows: When the master clock mclk and the slave clock sclk exhibit substantially time-aligned falling edges, the master latch 510 becomes transparent and the slave latch 550 becomes opaque. For instance, in response to the low logic level of the master clock mclk, the PMOS FET M9 turns on and applies Vdd (a logic one (1)) to the output (node pn2) of the NAND gate 520. Also, in response to the low logic level of the master clock mclk, the PMOS FET M1 turns on; thereby, applying Vdd to the source of PMOS FET M2. As the output (node pn2) of the NAND gate 520 is at a logic one (1), the NMOS FET M3 is turned on. Accordingly, the output (node pn1) of the OAI gate 512 receives the input data $d_m$ (albeit inverted, e.g., at $\overline{d_m}$). If the data $d_m$ is at a logic one (1), the node pn1 is at a logic zero (0). If the data $d_m$ is at a logic zero (0), the node pn1 is at a logic one (1). Thus, the master latch 510 is in transparent mode as it is able to receive the input data $d_m$.

With regard to the slave latch 550, the low logic level of the slave clock sclk turns off NMOS FET M15 to disable the AND operation of NMOS FETs M14 and M15. This configures the slave latch 550 in opaque mode. The low logic level of the slave clock sclk enables the NOR gate 556. Thus, the output of the NOR gate 556 being fed back to the gate of NMOS FET M18 operates to latch the previous data $d_{m-1}$. Thus, if the inverted previous data $d_{m-1}$ (i.e., $\overline{q}$) is a logic zero (0) and the slave clock sclk is at logic zero (0), the NOR gate 556 outputs the internal signal x as a logic one (1). The internal signal x being a logic one (1) turns on the NMOS FET M18 to couple the lower voltage rail to node pn3; thereby, latching a logic zero (0) at node pn3. The inverter 560 then generates the output signal q as a logic one (1). Thus, the output data q is based on the input data $d_{m-1}$.

If the inverted previous data $d_{m-1}$ (i.e., $\overline{q}$) is a logic one (1) and the slave clock sclk is at logic zero (0), the NOR gate 556 outputs the internal signal x as a logic zero (0). The internal signal x being a logic zero (0) turns off the NMOS FET M18. The inverter 554 inverts the logic one (1) at node pn3 to generate a logic zero (0) at the gate of PMOS FET M17. As the slave clock sclk is also at a logic zero (0), the PMOS FETs M16 and M17 turn on to apply the upper voltage rail Vdd to node pn3; thereby, latching a logic one (1) at node pn3. The inverter 560 then generates the output signal q as a logic zero (0). Thus, the output data q is based on the input data $d_{m-1}$.

When the master clock mclk and the slave clock sclk0 exhibit the next consecutive substantially time-aligned rising edges, the master latch 510 becomes opaque and the slave latch 550 becomes transparent. In response to the high logic level of the master clock mclk, the PMOS FET M1 turns off; thereby, disabling the logic OR operation of FETs M1-M4. The high logic level of the master clock mclk also turns off PMOS FET M9. Thus, the cross-coupled NAND gates operation of M5-M7 with inverter 514, and FETs M8, M10, and M11 of the NAND gate 520 latches the data $d_m$ received previously in the master transparent interval.

That is, if the data $d_m$ is a logic one (1), the node pn1 is at a logic zero (0). The inverter 514 inverts the logic zero (0) to generate a logic one (1) at the gate of NMOS FET M6. As the gate of NMOS FET M7 receives the high logic level of the master clock mclk, the NMOS FETs M6 and M7 are turned on to couple the lower voltage rail to node pn1; thereby, latching the logic zero (0) at node pn1. The logic zero (0) at node pn1 causes PMOS FET M8 to turn on, and NMOS FET M10 to turn off. The turning on of PMOS FET M8 applies the upper voltage rail Vdd to node pn2; thereby, latching a logic one (1) to node pn2. Node pn2 being at a logic one (1) turns off PMOS FET M4 to substantially isolate Vdd from the logic zero (0) at node pn1.

Conversely, if the data $d_m$ is a logic zero (0), the node pn1 is at a logic one (1). The inverter 514 inverts the logic one (1) to generate a logic zero (0) at the gate of NMOS FET M6. Accordingly, the NMOS FET M6 is turned off to substantially isolate node pn1 from the lower voltage rail. The logic one (1) at node pn1 causes PMOS FET M8 to turn off, and NMOS FET M10 to turn on. The turning off of PMOS FET M8 substantially isolates node pn2 from the upper voltage rail Vdd. The turning on of NMOS FET M10, and the master clock mclk being at a logic one (1) to turn on NMOS FET M11, couples the lower voltage rail to node pn2; ensuring that node pn2 is at a logic zero (0).

With regard to the slave latch 550, the high logic level of the slave clock sclk turns on NMOS FET M15, turns off PMOS FET M16, and causes the NOR gate 556 to generate the internal signal x as a logic zero (0) to turn on PMOS FET M12 and turn off NMOS FET M18. If the data $d_m$ latched in the master latch 510 is a logic one (1) at node pn2, and consequently, node pn1 is at a logic zero (0), then the output $\overline{pn1}$ of the inverter 514 is at a logic one (1). As the gate of NMOS FET M14 is coupled to the output of inverter 514, the logic one (1) turns on NMOS FET M14; thus, both NMOS FETs M14 and M15 being turned on causes the lower voltage rail to be applied to node pn3; thereby setting $\bar{q}$ to a logic zero (0). If the data $d_m$ latched in the master latch is a logic zero (0) at node pn2, both PMOS FETs M12 and M13 are turned on causing the upper voltage rail to be applied to node pn3; thereby setting $\bar{q}$ to a logic one (1). Thus, the slave latch 550 is in transparent mode as it is able to receive the data $d_m$ from the master latch 510.

The Racing Condition

With easier reference to FIG. 4, when the master latch 410 becomes opaque and the input data $d_m$ is a logic zero (0), the high logic level of the master clock mclk and the high logic level of the inverted data $\overline{d_m}$ at the output of the NAND gate 418 causes the NAND gate 412 to output at logic zero (0) at node pn2, which correlates with the input data $d_m$ being a logic zero (0).

However, because node pn2 of the master latch 410 is coupled to a set of slave latches 450-0 to 450-3, the node pn2 may see a relatively large capacitance. Thus, in response to the high logic level of the master clock mclk, the node pn2 may decrease slowly towards a logic zero (0). If the high logic level of the master clock mclk arrives at the second input of the NAND gate 418 before node pn2 is at a logic zero (0), the NAND gate 418 sees both its inputs at logic ones (1s), and outputs a logic zero (0). If the logic zero (0) outputted by the NAND gate 418 arrives at the second input of the NAND gate 412 before node pn2 decreases to a logic zero (0), the NAND gate 412 maintains node pn2 at a logic one (1), which does not correlate with the input data $d_m$ being a logic zero (0).

This is referred to as a racing condition because the path from the master clock mclk to pn2 via NAND gate 412 should be faster than the path from the master clock mclk to pn2 via the OAI gate 414 and the NAND gate 412.

A similar racing condition occurs in the slave latches. For example, considering slave latch 450-0, when the slave latch 450-0 becomes opaque and data $d_m$ at node pn2 is a logic one (1), the low logic level of the slave clock sclk0 causes the NOR gate 458-0 to output a logic one (1). Then, the low logic level of the slave clock sclk0 causes the AND gate 454-0 to output a logic zero (0). As the inputs to the NOR gate 456-0 are logic zero (0) and logic one (1), the NOR gate 456-0 outputs a logic zero (0). The inverter 460-0 inverts the logic zero (0) at the output of the NOR gate 456-0 to generate a logic one (1), which correlates with the logic one (1) of the data $d_m$ at node pn2.

However, if the low logic level of the slave clock sclk0 causes the AND gate 454-0 to output a logic zero (0) before the NOR gate 458-0 outputs a logic one (1), the NOR gate 456-0 sees logic zeros (0s) at its inputs, and outputs a logic one (1). In response to the logic one (1) outputted by the NOR gate 456-0 (which is at the first input of the NOR gate 458-0), the NOR gate 458-0 maintains the internal signal $x_0$ at a logic zero (0). The inverter 460-0 inverts the logic one (1) outputted by the NOR gate 456-0 to output a logic zero (0), which does not correlate with the logic one (1) of the data $d_m$ at node pn2.

Again, this is referred to as a racing condition because the path from the slave clock sclk0 to the input of the NOR gate 456-0 via the NOR gate 458-0 should be faster than the path from the slave clock sclk0 to input of the NOR gate 456-0 via the AND gate 454-0.

With reference again to FIG. 5, to ensure the correct path or sequence is undertaken when the master latch 510 and the slave latch 550 transitions to opaque mode, the master latch 510 includes the inverter 514 and the NMOS FET M6 in the configuration previously discussed, and the slave latch 550 includes the inverter 554 and the PMOS FET M17 in the configuration previously discussed.

For example, in the master latch 510, the proper sequence is that the node pn2 has to go low first before the node pn1 changes. Thus, the NMOS FET M6 being turned off while the node pn1 is at a logic one (1) due to the inversion by the inverter 514 prevents the node pn1 going low via the turned on NMOS FET M7. Thus, the node pn2 is able to go low, while the node pn1 remains at a high logic level, which is the correct response when the input data $d_m$ is zero (0) and the master clock mclk goes high to configure the master latch 510 in opaque mode.

Similarly, in the slave latch 550, the proper sequence is that the internal signal x has to go high before the node pn3 (f' node) is able to change. Thus, the PMOS FET M17 being turned off while the node pn3 is at a logic zero (0) due to the inversion by the inverter 554 prevents the node pn3 going high via the turned on PMOS FET M16. Thus, the internal signal x is able to go high, while the node pn3 remains at a low logic level, which is the correct response when the input data $d_m$ is one (1) and the slave clock sclk goes low to configure the slave latch 550 in opaque mode.

Falling Clock Transparency (FCT) Margin

Pursuant to ideal operation of the TSPC flip-flop 500, the master clock mclk and the slave clock sclk are in-phase. That is, the master clock mclk and the slave clock sclk have substantially time-aligned falling edges, respectively. However, if the phase of the slave clock sclk lags relative to the master clock mclk, and the slave latch 550 is configured in a typical manner (the gate of NMOS FET M14 is coupled to node pn2), then the node pn3 will be inadvertently discharged. If the master clock mclk exhibits a falling edge to configure the master latch 510 in transparent mode before the slave clock sclk exhibits a falling edge to configure the slave latch 550 in opaque mode, the node pn2 goes to a logic high, while the slave clock sclk is still at a logic high. Thus, the node pn2 and slave clock sclk being at logic highs turn on NMOS FETs M14-M15, which inadvertently discharges node pn3. In contrast, in the ideal operation, the node pn2 and the slave clock sclk go high and low at the same time, and thus, the slave clock sclk being low prevents node pn3 from discharging.

The falling clock transparency (FCT) margin is the tolerable skew or time difference between the falling edge of the master clock mclk and the falling edge of the slave clock sclk. In the typical implementation of the slave latch 550 with the gate of NMOS FET M14 being coupled to pn2, the FCT margin is one transistor stage delay; i.e., more specifically, the delay associated with the turning on of PMOS FET M9 in response to the falling edge of the master clock mclk.

However, in the slave latch 550, the gate of the NMOS FET M14 is coupled to node $\overline{pn1}$ at the output of the inverter 514. The signal at node $\overline{pn1}$ is delayed version of the data at node pn2. For instance, in response to the falling edge of the master clock mclk, the node $\overline{pn1}$ goes high after three (3) transistor stages: (1) the turning on of PMOS FET M9 in response to the falling edge of the master clock mclk (i.e., node pn2 goes high); (2) the turning on of the NMOS FET M3 in response to node pn2 going high (node pn1 goes low via turned on NMOS FETs M3-M4); and (3) the PMOS FET internal to the inverter 514 turning on in response to the low at node pn1. Thus, the slave clock sclk may be able to stay high for three (3) transistor stage delay before the node pn3 is inadvertently pulled down. Thus, by coupling the gate of NMOS FET M14 to node $\overline{pn1}$, the FCT margin can be extended to three (3) transistor stages.

Figure 6:
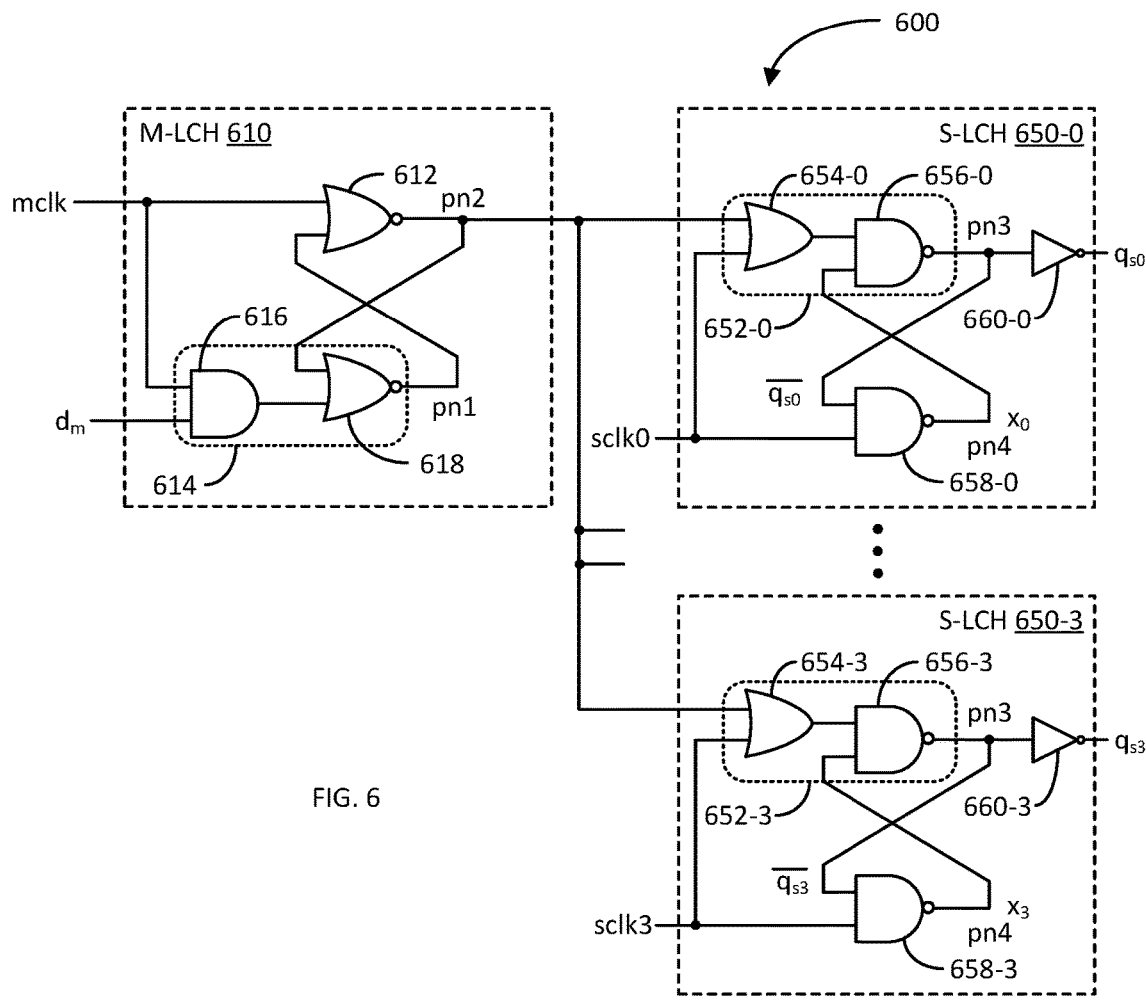
FIG. 6 illustrates a schematic diagram of another example true single phase clock (TSPC) flip-flop in accordance with another aspect of the disclosure.

FIG. 6 illustrates a schematic diagram of another example true single phase clock (TSPC) flip-flop 600 in accordance with another aspect of the disclosure. The TSPC flip-flop 600 is an example complementary version of the TSPC flip-flop 400 previously discussed.

In particular, the TSPC flip-flop 600 includes a master latch 610 and a set of slave latches 650-0 to 650-3. The master latch 610 may correspond to any one of the master latches 110-0 to 110-3 of latch array 100. The set of slave latches 650-0 to 650-3 may correspond to a column of slave latches of the latch array 100 that are coupled to the master latch 610. For example, the master latch 610 may correspond to master latch 110-0 of the latch array 100, and the set of slave latches 650-0 to 650-3 may correspond to slave latches 130-00 to 130-30, respectively.

The master latch 610 includes a NOR gate 612 and an AND-OR-Inverter (AOI) gate 614 including an AND gate 616 and a NOR gate 618. The NOR gate 612 includes a first input configured to receive the master clock mclk, and an output (node pn2) coupled to a first input of the NOR gate 618 of the AOI gate 614. The AND gate 616 of the AOI gate 614 includes a first input configured to receive the master clock mclk, and a second input configured to receive an input data $d_m$. The AND gate 616 includes an output coupled to a second input of the NOR gate 618 of the AOI gate 614. The NOR gate 618 includes an output (node pn1) coupled to a second input of the NOR gate 612.

The set of slave latches 650-0 to 650-3 are similarly configured. Taking slave latch 650-0 as an example, the slave latch 650-0 includes an OR-AND-Inverter (OAI) gate 652-0 including an OR gate 654-0 and a NAND gate 656-0, a NAND gate 658-0, and an inverter 660-0. The OR gate 654-0 of the OAI gate 652-0 includes a first input coupled to an output (node pn2) of the NOR gate 612 of the master latch 610, a second input configured to receive a corresponding slave clock sclk0, and an output coupled to a first input of the NAND gate 656-0 of the OAI gate 652-0. The NAND gate 656-0 of the OAI gate 652-0 includes a second input coupled to an output (node pn4) of the NAND gate 658-0. The NAND gate 656-0 of the OAI gate 652-0 includes an output (node pn3) coupled to a first input of the NAND gate 658-0 and to an input of the inverter 660-0. The NAND gate 658-0 includes a second input configured to receive the corresponding slave clock sclk0. The output (node pn3) of the NAND gate 656-0 is configured to produce a complementary output data $\overline{q_{s0}}$, the output of the inverter 660-0 is configured to produce a non-complementary output data $q_{s0}$, and an output (node pn4) of the NAND gate 658-0 is configured to produce an internal signal $x_0$.

As mentioned, the other slave latches 650-1 to 650-3 of the set or column are configured similarly as that of slave latch 650-0, but are configured to receive instead the corresponding slave clocks sclk1 to sclk-3, respectively. For clarity, the slave latch 650-3 includes an OR-AND-Inverter (OAI) gate 652-3 including an OR gate 654-3 and a NAND gate 656-3, a NAND gate 658-3, and an inverter 660-3. The OR gate 654-3 of the OAI gate 652-3 includes a first input coupled to an output (node pn2) of the NOR gate 612 of the master latch 610, a second input configured to receive a corresponding slave clock sclk3, and an output coupled to a first input of the NAND gate 656-3 of the OAI gate 652-3. The NAND gate 656-3 of the OAI gate 652-3 includes a second input coupled to an output (node pn4) of the NAND gate 658-3. The NAND gate 656-3 of the OAI gate 652-3 includes an output (node pn3) coupled to a first input of the NAND gate 658-3 and to an input of the inverter 660-3. The NAND gate 658-3 includes a second input configured to receive the corresponding slave clock sclk3. The output (node pn3) of the NAND gate 656-3 is configured to produce a complementary output data $\overline{q_{s3}}$, the output of the inverter 660-3 is configured to produce a non-complementary output data $q_{s3}$, and an output (node pn4) of the NAND gate 658-3 is configured to produce an internal signal $x_3$.

The writing of data $d_m$ to the slave latch 650-0 may be as follows: When the master clock mclk and the slave clock sclk0 exhibit substantially time-aligned rising edges, the master latch 610 becomes transparent and the slave latch 650-0 becomes opaque. In response to the high logic level of the master clock mclk, the NOR gate 612 outputs a logic zero (0) at node pn2. Also, in response to the high logic level of the master clock mclk, the AND gate 616 of the AOI gate 614 allows the data $d_m$ (albeit inverted) to propagate to the second input of the NOR gate 612 via the NOR gate 618. Thus, the master latch 610 is in transparent mode as it is able to receive the input data $d_m$.

With regard to the slave latch 650-0, the high logic level of the slave clock sclk0 disables the OR gate 654-0 of the OAI gate 652-0 to make the slave latch 650-0 opaque. Thus, the cross-coupled OAI gate 652-0 and NAND gate 658-0 maintain the previous inverted data $\overline{d_{m-1}}$ or $\overline{q_{s0}}$ latched. The inverter 660-0 inverts previous inverted data $\overline{d_{m-1}}$ or $\overline{q_{s0}}$ to generate the output data $q_{s0}$. By the same token, the unaddressed slave latches 650-1 to 650-3, in this example, also have their OR gates 654-1 to 654-3 disabled via high logic levels of the slave clocks sclk1 to sclk3, respectively. Thus, in contrast to the TSPC flip-flop 300, the toggling of the output (node pn2) of the NOR gate 612 of the master latch 610 does not corrupt the latching of the data in the unaddressed slave latches 650-1 to 650-3.

When the master clock mclk and the slave clock sclk0 exhibit the next consecutive substantially time-aligned falling edges, the master latch 610 becomes opaque and the slave latch 650-0 becomes transparent. In response to the low logic level of the master clock mclk, the NOR gate 612 is enabled; thereby, causing the cross-coupled NOR gates 612 and AOI gate 614 to latch the current data $d_m$. Also, in response to the low logic level of the master clock mclk, the AND gate 616 of the AOI gate 614 is disabled; thereby, preventing the new data $d_{m+1}$ (or noise at the input) from corrupting the latching of the current data $d_m$ by the cross-coupled NOR gate 612 and AOI gate 614. Thus, the master latch 610 is in opaque mode.

With regard to the slave latch 650-0, the low logic level of the slave clock sclk0 enables the OR gate 654-0 of the OAI gate 652-0. Thus, the current data $d_m$ (albeit inverted) propagates to the first input of the NAND gate 658-0 via the NAND gate 656-0. The low logic level of the slave clock sclk0 disables the NAND gate 658-0 causing it to generate the internal signal $x_0$ as a logic one (1) at node pn4. Thus, the slave latch 650-0 is in transparent mode. With regard to the unaddressed slave latches 650-1 to 650-3, in this example, their OR gates 654-1 to 654-3 are disabled via high logic levels of the slave clocks sclk1 to sclk3, respectively. Thus, the logic value of the current data $d_m$ at the output (node pn2) of the NOR gate 612 of the master latch 610 does not affect the data latched by the unaddressed slave latches 650-1 to 650-3.

Figure 7:
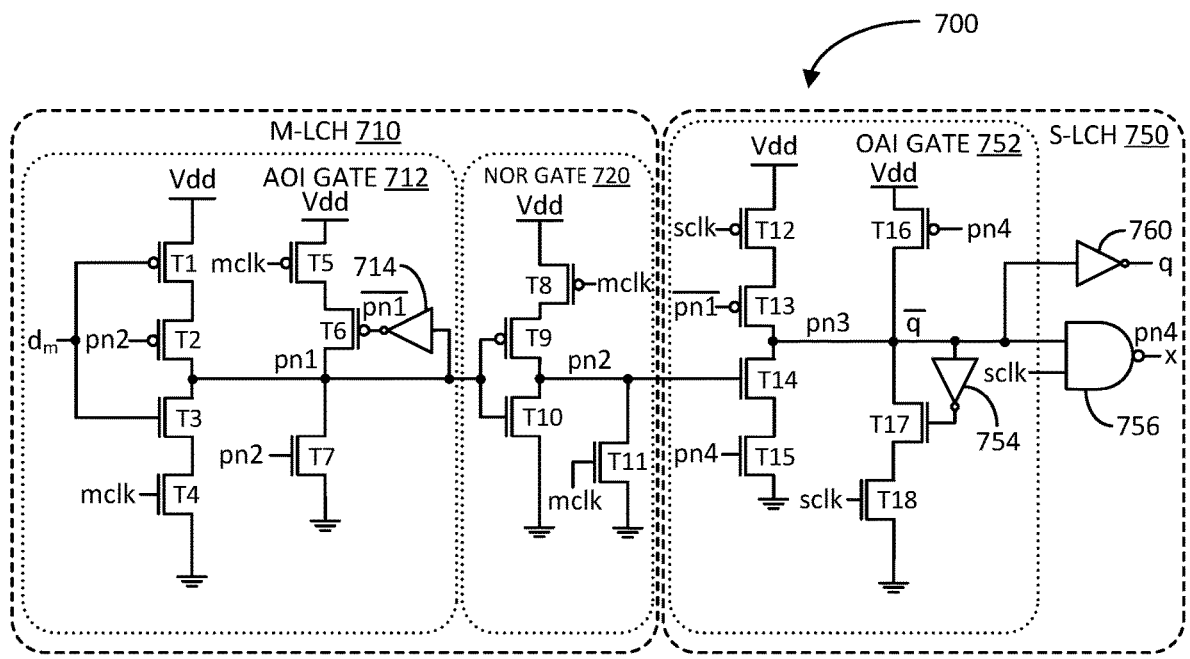
FIG. 7 illustrates a schematic diagram of another example true single phase clock (TSPC) flip-flop in accordance with another aspect of the disclosure.

FIG. 7 illustrates a schematic diagram of another example true single phase clock (TSPC) flip-flop 700 in accordance with another aspect of the disclosure. The TSPC 700 is an example complementary version of the TSPC 500 previously discussed. The TSPC 700 includes a master latch (M-LCH) 710 and a slave latch (S-LCH) 750, which may correspond to master latch 610 and any one of the set of slave latches 650-0 to 650-3, respectively. The master latch 710 includes an AND-OR-Inverter (AOI) gate 712 cross-coupled with a NOR gate 720. The slave latch 750 includes an OR-AND-Inverter (OAI) gate 752 cross-coupled with a NAND gate 756, and an inverter 760.

In particular, the master latch 710 includes a first PMOS FET T1 and a second PMOS FET T2 coupled in series between an upper voltage rail Vdd and an output (node pn1) of the AOI gate 712. The master latch 710 further includes a first NMOS FET T3 and a second NMOS FET T4 coupled in series between the output (node pn1) of the AOI gate 712 and a lower voltage rail (e.g., ground). The PMOS FET T1 includes a gate configured to receive the input data $d_m$, the PMOS FET T2 includes a gate coupled to an output (node pn2) of the NOR gate 720, the NMOS FET T3 includes a gate configured to receive the input data $d_m$, and the NMOS FET T4 includes a gate configured to receive the master clock mclk.

The master latch 710 further includes PMOS FET T5, PMOS FET T6, NMOS FET T7, and inverter 714. The PMOS FETs T5 and T6 are coupled in series between the upper voltage rail Vdd and the output (node pn1) of the AOI gate 712. The PMOS FET T5 includes a gate configured to receive the master clock mclk, and the PMOS FET T6 includes a gate coupled to an output of the inverter 714. The inverter 714 includes an input coupled to the output (node pn1) of the AOI gate 712. The NMOS FET T7 is coupled between the output (node pn1) of the AOI gate 712 and the lower voltage rail, and includes a gate coupled to the output (node pn2) of the NOR gate 720. Similarly, the circuitry including the inverter 714 and the PMOS FET T6 is to address a racing condition and a falling clock transparency (FCT) margin, as previously discussed.

The NOR gate 720 further includes a PMOS FET T8 and a PMOS FET T9 coupled in series between the upper voltage rail Vdd and the output (node pn2) of the NOR gate 720, and an NMOS FET T10 coupled in parallel with NMOS FET T11 between the output (node pn2) of the NOR gate 720 and the lower voltage rail. The PMOS FET T9 and NMOS FET T10 include gates coupled to output (node pn1) of the AOI gate 712, the PMOS FET T8 includes a gate configured to receive the master clock mclk, and the NMOS FET T11 includes a gate configured to receive the master clock mclk.

With regard to the slave latch 750, the OAI gate 752 includes a PMOS FET T12 and a PMOS FET T13 coupled in series between the upper voltage rail Vdd and an output (node pn3) of the OAI gate 752. The OAI gate 752 further includes an NMOS FET T14 and NMOS FET T15 coupled in series between the output (node pn3) of the OAI gate 752 and the lower voltage rail. The PMOS FET T12 includes a gate configured to receive the corresponding slave clock sclk, the PMOS FET T13 includes a gate coupled to the node $\overline{pn1}$ at the output of the inverter 714, the NMOS FET T14 includes a gate coupled to the output (node pn2) of the NOR gate 720, and the NMOS FET T15 includes a gate coupled to an output (node pn4) of the NAND gate 756.

The OAI gate 752 further includes a PMOS FET T16 coupled between the upper voltage rail Vdd and the output (node pn3) of the OAI gate 752, and includes a gate coupled to the output (node pn4) of the NAND gate 756. Additionally, the OAI gate 752 includes an NMOS FET T17 and an NMOS FET T18 coupled in series between the output (node pn3) of the OAI gate 752 and the lower voltage rail. Further, the OAI gate 752 includes an inverter 754 including an input coupled to the output (node pn3) of the OAI gate 752 and an output coupled to a gate of NMOS FET T17. The NMOS FET T18 includes a gate configured to receive the corresponding slave clock sclk. Similarly, the circuitry including the inverter 754 and the NMOS FET T17 is to address the racing condition, as previously discussed.

The NAND gate 756 of the slave latch 750 includes a first input coupled to the output (node pn3) of the OAI gate 752, a second input configured to receive the corresponding slave clock sclk, and the output (node pn4) to generate an internal signal x. The inverter 760 includes an input coupled to the output (node pn3) of the OAI gate 752, and an output configured to generate an output data q.

The writing of data $d_m$ to the slave latch 750 may be as follows: When the master clock mclk and the slave clock sclk exhibit substantially time-aligned rising edges, the master latch 710 becomes transparent and the slave latch 750 becomes opaque. For instance, in response to the high logic level of the master clock mclk, the NMOS FET T11 turns on and applies the lower voltage rail (e.g., a logic zero (0)) to the output (node pn2) of the NOR gate 720. Also, in response to the high logic level of the master clock mclk, the NMOS FET T4 turns on; thereby, grounding the source of NMOS FET T3. As the output (node pn2) of the NOR gate 720 is at a logic zero (0), the PMOS FET T2 is turned on. Accordingly, the output (node pn1) of the AOI gate 712 receives the input data $d_m$ (albeit inverted, e.g., at $\overline{d_m}$). If the data $d_m$ is at a logic one (1), the node pn1 is at a logic zero (0). If the data $d_m$ is at a logic zero (0), the node pn1 is at a logic one (1). Thus, the master latch 710 is in transparent mode as it is able to receive the input data $d_m$.

With regard to the slave latch 750, the high logic level of the slave clock sclk turns off PMOS FET T12 to disable the AND operation of NMOS FETs T13-T15. This configures the slave latch 750 in opaque mode. The high logic level of the slave clock sclk enables the NAND gate 756. Thus, the output of the NAND gate 756 being fed back to the gate of PMOS FET T16 operates to latch the previous data $d_{m-1}$.

Thus, if the inverted previous data $d_{m-1}$ (i.e., $\bar{q}$) is a logic one (1) and the slave clock sclk is at logic one (1), the NAND gate 756 outputs the internal signal x as a logic zero (0). The internal signal x being a logic zero (0) turns on the PMOS FET T16 to couple the upper voltage rail Vdd to node pn3; thereby, latching a logic one (1) at node pn3. The inverter 760 then generates the output signal q as a logic zero (0). Thus, the output data q is based on the input data $d_{m-1}$.

If the inverted previous data $d_{m-1}$ (i.e., $\bar{q}$) is a logic zero (0) and the slave clock sclk is at logic one (1), the NAND gate 756 outputs the internal signal x as a logic one (1). The internal signal x being a logic one (1) turns off the PMOS FET T16. The inverter 754 inverts the logic zero (0) at node pn3 to generate a logic one (1) at the gate of NMOS FET T17. As the slave clock sclk is also at a logic one (1), the NMOS FETs T17 and T18 turn on to apply the lower voltage rail to node pn3; thereby, latching a logic zero (0) at node pn3. The inverter 760 then generates the output signal q as a logic one (1). Thus, the output data q is based on the input data $d_{m-1}$.

When the master clock mclk and the slave clock sclk0 exhibit the next consecutive substantially time-aligned falling edges, the master latch 710 becomes opaque and the slave latch 750 becomes transparent. In response to the low logic level of the master clock mclk, the NMOS FET T4 turns off; thereby, disabling the logic AND operation of FETs T1-T4. The low logic level of the master clock mclk also turns off NMOS FET M11. Thus, the cross-coupled NOR gates operation of T5-T7 with inverter 714, and FETs T8, T9, and T10 of the NOR gate 720 latches the data $d_m$ received previously in the master transparent interval.

That is, if the data $d_m$ is a logic zero (0), the node pn1 is at a logic one (1). The inverter 714 inverts the logic one (1) to generate a logic zero (0) at the gate of PMOS FET T6. As the gate of PMOS FET T5 receives the low logic level of the master clock mclk, the PMOS FETs T5 and T6 are turned on to couple the upper voltage rail Vdd to node pn1; thereby, latching the logic one (1) at node pn1. The logic one (1) at node pn1 causes PMOS FET T9 to turn off, and NMOS FET T10 to turn on. The turning on of NMOS FET T10 applies the lower voltage rail to node pn2; thereby, latching a logic zero (0) to node pn2. Node pn2 being at a logic zero (0) turns off NMOS FET T7 to substantially isolate the lower voltage rail from the logic one (1) at node pn1.

Conversely, if the data $d_m$ is a logic one (1), the node pn1 is at a logic zero (0). The inverter 714 inverts the logic zero (0) to generate a logic one (1) at the gate of PMOS FET T6. Accordingly, the PMOS FET T6 is turned off to substantially isolate node pn1 from the upper voltage rail Vdd. The logic zero (0) at node pn1 causes PMOS FET T9 to turn on, and NMOS FET T10 to turn off. The turning off of NMOS FET T10 substantially isolates node pn2 from the lower voltage rail. The turning on of PMOS FET T9, and the master clock mclk being at a logic zero (0) to turn on PMOS FET T8, couples the upper voltage rail Vdd to node pn2; ensuring that node pn2 is at a logic one (1).

With regard to the slave latch 750, the low logic level of the slave clock sclk turns on PMOS FET T12, turns off NMOS FET T18, and causes the NAND gate 756 to generate the internal signal x as a logic one (1) to turn on NMOS FET T15 and turn off PMOS FET T16. If the data $d_m$ latched in the master latch 710 is a logic zero (0) at node pn2, and consequently, node pn1 is at a logic one (1), then the output $\overline{pn1}$ of the inverter 714 is at a logic zero (0). As the gate of PMOS FET T13 is coupled to the output of inverter 714, the logic zero (0) turns on PMOS FET T13; thus, both PMOS FETs T12 and T13 being turned on causes the upper voltage rail Vdd to be applied to node pn3; thereby setting $\bar{q}$ to a logic one (1). If the data $d_m$ latched in the master latch is a logic one (1) at node pn2, both NMOS FETs T14 and T15 are turned on causing the lower voltage rail to be applied to node pn3; thereby setting $\bar{q}$ to a logic zero (0). Thus, the slave latch 750 is in transparent mode as it is able to receive the data $d_m$ from the master latch 710.

Figure 8:
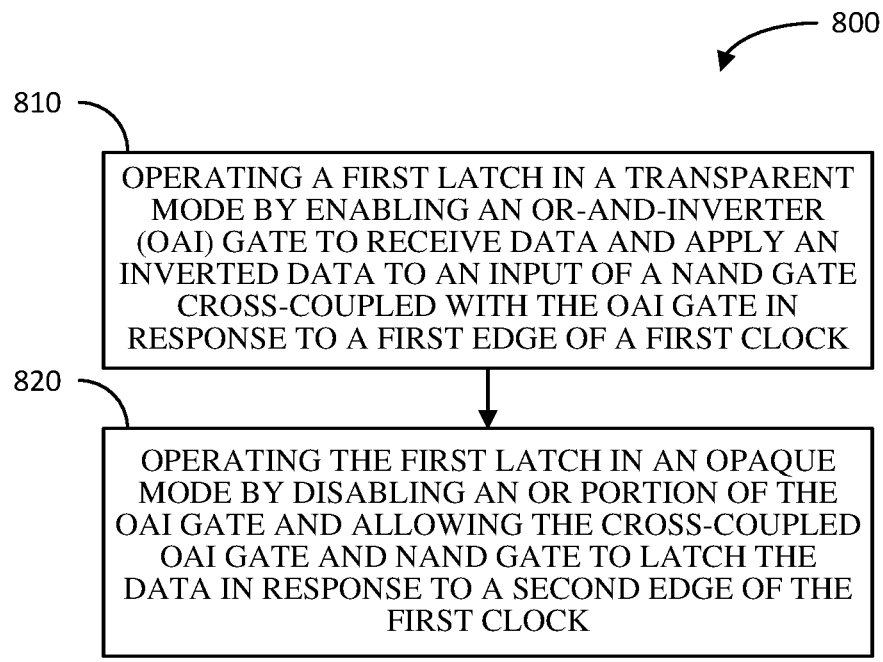
FIG. 8 illustrates a flow diagram of an example method of storing data in accordance with another aspect of the disclosure.

FIG. 8 illustrates a flow diagram of an example method 800 of storing data in accordance with another aspect of the disclosure. The method 800 includes operating a first latch in a transparent mode by enabling an OR-AND-Inverter (OAI) gate to receive data and apply an inverted data to an input of a NAND gate cross-coupled with the OAI gate in response to a first edge of a first clock (block 810). The method 800 further includes operating the first latch in an opaque mode by disabling an OR portion of the OAI gate and allowing the cross-coupled OAI gate and NAND gate to latch the data in response to a second edge of the first clock (block 820). The first latch including the OAI gate and the NAND gate may correspond to any one of master latches 410 and 510 previously discussed. The method 800 may further include preventing an output of the OAI gate from changing logic state prior to an output of the NAND gate changing logic state in response to the second edge of the first clock.

The method 800 may further include operating a second latch in a transparent mode by enabling an AND-OR-Inverter (AOI) gate to receive the data from the first latch and apply the inverted data to an input of a NOR gate cross-coupled with the AOI gate in response to a first edge of a second clock. The second latch including the AOI gate and the NOR gate may correspond to any one of slave latches 450-0 to 450-3 and 550 previously discussed. Additionally, the method 800 may include preventing an output of the AOI gate from changing logic state prior to an output of the NOR gate changing logic state in response to the second edge of the second clock. The method 800 may also include delaying an application of the data from the first latch to the second latch to increase a tolerable margin between the second edge of the second clock and the first edge of the first clock.

Figure 9:
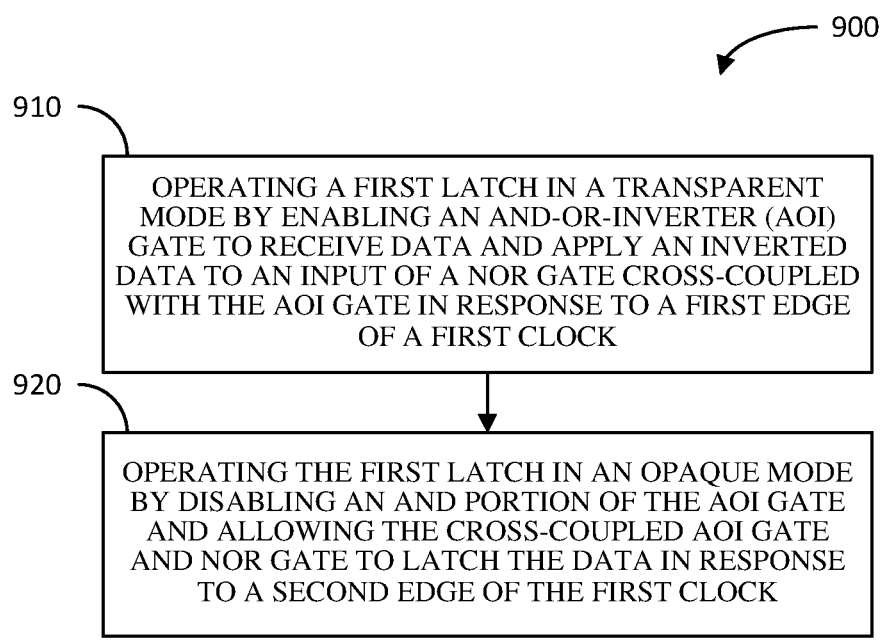
FIG. 9 illustrates a flow diagram of an example method of storing data in accordance with another aspect of the disclosure.

FIG. 9 illustrates a flow diagram of an example method 900 of storing data in accordance with another aspect of the disclosure. The method 900 includes operating a first latch in a transparent mode by enabling an AND-OR-Inverter (AOI) gate to receive data and apply an inverted data to an input of a NOR gate cross-coupled with the AOI gate in response to a first edge of a first clock (block 910). The method 900 further includes operating the first latch in an opaque mode by disabling an AND portion of the AOI gate and allowing the cross-coupled AOI gate and NOR gate to latch the data in response to a second edge of the first clock (block 920). The first latch including the AOI gate and the NOR gate may correspond to any one of master latches 610 and 710 previously discussed. The method 900 may further include preventing an output of the AOI gate from changing logic state prior to an output of the NOR gate changing logic state in response to the second edge of the first clock.

The method 900 may further include operating a second latch in a transparent mode by enabling an OR-AND-Inverter (OAI) gate to receive the data from the first latch and apply the inverted data to an input of a NAND gate cross-coupled with the OAI gate in response to a first edge of a second clock. The second latch including the OAI gate and the NAND gate may correspond to any one of slave latches 650-0 to 650-3 and 750 previously discussed. Additionally, the method 900 may include preventing an output of the OAI gate from changing logic state prior to an output of the NAND gate changing logic state in response to the second edge of the second clock. The method 900 may also include delaying an application of the data from the first latch to the second latch to increase a tolerable margin between the second edge of the second clock and the first edge of the first clock.

Figure 10:
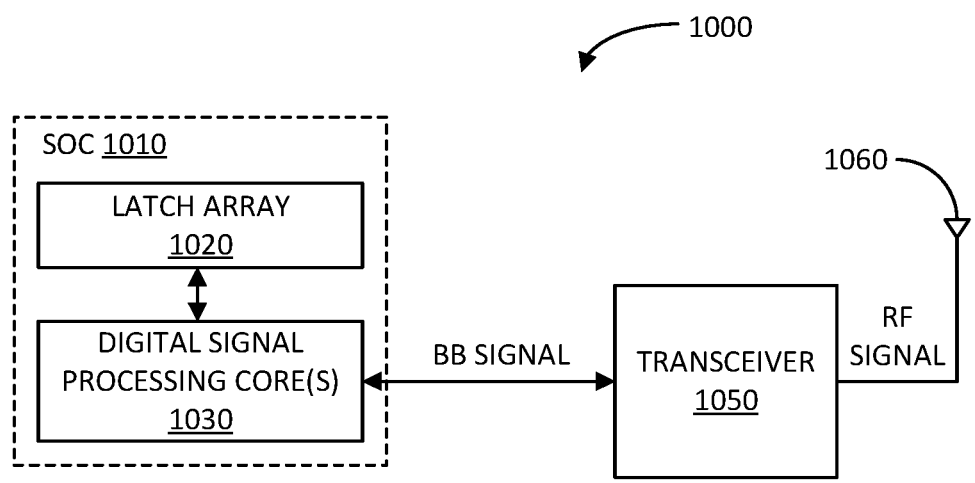
FIG. 10 illustrates a block diagram of an example wireless communication device in accordance with another aspect of the disclosure.

FIG. 10 illustrates a block diagram of an example wireless communication device 1000 in accordance with another aspect of the disclosure. The wireless communication device 1000 includes an integrated circuit (IC) 1010, which may be configured as a system on chip (SOC), a transceiver 1050, and at least one antenna 1060. The IC or SOC 1010 includes a latch array 1020 and one or more digital signal processing cores 1030. The latch array 1020 may be configured similar to latch array 100 with master latches configured per any of the master latches 410 and 510 previously discussed, and slave latches configured per any of the slave latches 450-0 to 450-3 and 550 previously discussed.

The at least one antenna 1060 is configured to wirelessly receive a radio frequency (RF) receive signal and wirelessly transmit an RF transmit signal. The transceiver 1050 is configured to convert the RF receive signal into a baseband receive signal, and convert a baseband transmit signal into the RF transmit signal. The one or more digital signal processing cores may be configured to: process the baseband receive signal to generate first data, and generate the baseband transmit signal based on second data. The latch array may be configured to store the first and second data.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
    a first latch comprising:
        an OR-AND-Inverter (OAI) gate comprising:
            an OR gate including a first input configured to receive a first clock, and a second input configured to receive an input data; and
            a first NAND gate including a first input coupled to an output of the OR gate; and
        a second NAND gate including a first input configured to receive the first clock, a second input coupled to an output of the first NAND gate, and an output coupled to a second input of the first NAND gate; and
    a second latch comprising:
        an AND-OR-Inverter (AOI) gate comprising
            an AND gate including a first input configured to receive the input data, and a second input configured to receive a second clock, and
            a first NOR gate including a first input coupled to an output of the AND gate; and
        a second NOR gate including a first input configured to receive the second clock, a second input coupled to an output of the first NOR gate, and an output coupled to the second input of the OR gate of the OAI gate of the first latch.

2. The apparatus of claim 1, wherein the OAI gate comprises:
    a first field effect transistor (FET) including a gate configured to receive the first clock;
    a second FET including a gate configured to receive the input data, wherein the first and second FETs are coupled in series between a first voltage rail and the output of the first NAND gate;
    a third FET including a gate coupled to the output of the second NAND gate;
    a fourth FET including a gate configured to receive the input data, wherein the third and fourth FETs are coupled in series between the output of the first NAND gate and a second voltage rail.

3. The apparatus of claim 2, wherein the OAI gate further comprises:
    a fifth FET including a gate coupled to the output of the second NAND gate, wherein the fifth FET is coupled between the first voltage rail and the output of the first NAND gate; and
    a sixth FET including a gate configured to receive the first clock, wherein the sixth FET is coupled between the output of the first NAND gate and the second voltage rail.

4. The apparatus of claim 3, wherein the OAI gate further comprises:
    an inverter including an input coupled to the output of the first NAND gate; and
    a seventh FET including a gate coupled to an output of the inverter, wherein the seventh FET is coupled between the output of the first NAND gate and the sixth FET.

5. The apparatus of claim 4, wherein the first, second, and fifth FETs are each configured as a p-channel metal oxide semiconductor field effect transistor (PMOS FET), and wherein the third, fourth, sixth, and seventh FETs are each configured as an n-channel metal oxide semiconductor field effect transistor (NMOS FET).

6. The apparatus of claim 1, wherein the second NAND gate comprises:
    a first field effect transistor (FET) including a gate coupled to the output of the first NAND gate, wherein the first FET is coupled between a first voltage rail and the output of the second NAND gate;
    a second FET including a gate configured to receive the first clock, wherein the second FET is coupled between the first voltage rail and the output of the second NAND gate;
    a third FET including a gate coupled to the output of the first NAND gate; and
    a fourth FET including a gate configured to receive the first clock, wherein the third and fourth FETs are coupled in series between the output of the second NAND gate and a second voltage rail.

7. The apparatus of claim 6, wherein the first and second FETs are each configured as a p-channel metal oxide semiconductor field effect transistor (PMOS FET), and wherein the third and fourth FETs are each configured as an n-channel metal oxide semiconductor field effect transistor (NMOS FET).

8. An apparatus, comprising:
    a first latch comprising
        an OR-AND-Inverter (OAI) gate comprising
            an OR gate including a first input configured to receive a first clock, and a second input configured to receive an input data, and
            a first NAND gate including a first input coupled to an output of the OR gate; and
        a second NAND gate including a first input configured to receive the first clock, a second input coupled to an output of the first NAND gate, and an output coupled to a second input of the first NAND gate; and a second latch comprising
 an AND-OR-Inverter (AOI) gate comprising
  an AND gate including a first input coupled to the output of the second NAND gate of the first latch, a second input configured to receive a second clock, and
  a first NOR gate including a first input coupled to an output of the AND gate; and
 a second NOR gate including a first input configured to receive the second clock, a second input coupled to an output of the first NOR gate, and an output coupled to a second input of the first NOR gate.

9. The apparatus of claim 8, wherein the second latch further comprises an inverter including an input coupled to the output of the first NOR gate, and an output configured to produce an output data based on the input data.

10. The apparatus of claim 8, wherein the AOI gate comprises:
 a first field effect transistor (FET) including a gate coupled to the output of the second NOR gate;
 a second FET including a gate coupled to the output of the second NAND gate of the first latch, wherein the first and second FETs are coupled in series between a first voltage rail and the output of the first NOR gate;
 a third FET including a gate coupled to an output of an inverter of the first latch, wherein an input of the inverter is coupled to the output of the first NAND gate; and
 a fourth FET including a gate configured to receive the second clock, wherein the third and fourth FETs are coupled in series between the output of the first NOR gate and a second voltage rail.

11. The apparatus of claim 10, wherein the AOI gate further comprises:
 a fifth FET including a gate configured to receive the second clock, wherein the fifth FET is coupled between the first voltage rail and the output of the first NOR gate; and
 a sixth FET including a gate coupled to the output of the second NOR gate, wherein the sixth FET is coupled between the output of the first NOR gate and the second voltage rail.

12. The apparatus of claim 11, wherein the AOI gate further comprises:
 an inverter including an input coupled to the output of the first NOR gate;
 a seventh FET including a gate coupled to an output of the inverter, wherein the seventh FET is coupled between the fifth FET and the output of the first NOR gate.

13. The apparatus of claim 12, wherein the first, second, fifth, and seventh FETs are each configured as a p-channel metal oxide semiconductor field effect transistor (PMOS FET), and wherein the third, fourth, and sixth FETs are each configured as an n-channel metal oxide semiconductor field effect transistor (NMOS FET).

14. An apparatus, comprising:
 a latch comprising:
  an AND-OR-Inverter (AOI) gate comprising:
   an AND gate including a first input configured to receive an input data, and a second input configured to receive a clock,
   a first NOR gate including a first input coupled to an output of the AND gate, a first field effect transistor (FET) including a gate coupled to the output of the second NOR gate,
 a second FET including a gate configured to receive the input data, wherein the first and second FETs are coupled in series between a first voltage rail and the output of the first NOR gate,
 a third FET including a gate configured to receive a signal based on a delayed version of the input data, and
 a fourth FET including a gate configured to receive the clock, wherein the third and fourth FETs are coupled in series between the output of the first NOR gate and a second voltage rail; and
 a second NOR gate including a first input configured to receive the clock, a second input coupled to an output of the first NOR gate, and an output coupled to a second input of the first NOR gate.

15. The apparatus of claim 14, wherein the latch further comprises an inverter including an input coupled to the output of the first NOR gate, and an output configured to produce an output data based on the input data.

16. The apparatus of claim 14, wherein the AOI gate further comprises:
 a fifth FET including a gate configured to receive the clock, wherein the fifth FET is coupled between the first voltage rail and the output of the first NOR gate; and
 a sixth FET including a gate coupled to the output of the second NOR gate, wherein the sixth FET is coupled between the output of the first NOR gate and the second voltage rail.

17. The apparatus of claim 16, wherein the AOI gate further comprises:
 an inverter including an input coupled to the output of the first NOR gate; and
 a seventh FET including a gate coupled to an output of the inverter, wherein the seventh FET is coupled between the fifth FET and the output of the first NOR gate.

18. The apparatus of claim 17, wherein the first, second, fifth, and seventh FETs are each configured as a p-channel metal oxide semiconductor field effect transistor (PMOS FET), and wherein the third, fourth, and sixth FETs are each configured as an n-channel metal oxide semiconductor field effect transistor (NMOS FET).

19. A method, comprising:
 operating a first latch in a transparent mode by enabling an OR-AND-Inverter (OAI) gate to receive data and apply an inverted data to an input of a NAND gate cross-coupled with the OAI gate in response to a first edge of a first clock;
 operating the first latch in an opaque mode by disabling an OR portion of the OAI gate and allowing the cross-coupled OAI gate and NAND gate to latch the data in response to a second edge of the first clock;
 operating a second latch in a transparent mode by enabling an AND-OR-Inverter (AOI) gate to receive the data from the first latch and apply the inverted data to an input of a NOR gate cross-coupled with the AOI gate in response to a first edge of a second clock; and
 operating the second latch in an opaque mode by disabling an AND portion of the AOI gate and allowing the cross-coupled AOI gate and NOR gate to latch the data in response to a second edge of the second clock.

20. The method of claim 19, further comprising preventing an output of the OAI gate to change logic state prior to an output of the NAND gate changing logic state in response to the second edge of the first clock.

21. The method of claim 19, further comprising preventing an output of the AOI gate to change logic state prior to an output of the NOR gate changing logic state in response to the second edge of the second clock.

22. The method of claim 19, further comprising delaying an application of the data from the first latch to the second latch to increase a tolerable margin between the second edge of the second clock and the first edge of the first clock.

23. A wireless communication device, comprising:
at least one antenna configured to wirelessly receive a radio frequency (RF) receive signal and wirelessly transmit an RF transmit signal;
a transceiver configured to:
convert the RF receive signal into a baseband receive signal; and
convert a baseband transmit signal into the RF transmit signal;
one or more digital signal processing cores configured to:
process the baseband receive signal to generate first data; and
generate the baseband transmit signal based on second data; and
a latch array configured to store the first and second data, wherein the latch array comprises at least a first latch comprising:
an OR-AND-Inverter (OAI) gate comprising:
an OR gate including a first input configured to receive a first clock, and a second input configured to receive the first and second data; and
a first NAND gate including a first input coupled to an output of the OR gate; and
a second NAND gate including a first input configured to receive the first clock, a second input coupled to an output of the first NAND gate, and an output coupled to a second input of the first NAND gate.

24. The wireless communication device of claim 23, wherein the latch array further comprises a second latch comprising:
an AND-OR-Inverter (AOI) gate comprising:
an AND gate including a first input coupled to the output of the second NAND gate of the first latch, a second input configured to receive a second clock; and
a first NOR gate including a first input coupled to an output of the AND gate; and
a second NOR gate including a first input configured to receive the second clock, a second input coupled to an output of the first NOR gate, and an output coupled to a second input of the first NOR gate.

25. The wireless communication device of claim 23, wherein the latch array further comprises a second latch comprising:
an AND-OR-Inverter (AOI) gate comprising:
an AND gate including a first input configured to receive input data, and a second input configured to receive a second clock; and
a first NOR gate including a first input coupled to an output of the AND gate; and
a second NOR gate including a first input configured to receive the second clock, a second input coupled to an output of the first NOR gate, and an output coupled to the second input of the OR gate of the OAI gate of the first latch.

26. A method, comprising:
operating a first latch in a transparent mode by enabling an AND-OR-Inverter (AOI) gate to receive data and apply an inverted data to an input of a NOR gate cross-coupled with the AOI gate in response to a first edge of a first clock;
operating the first latch in an opaque mode by disabling an AND portion of the AOI gate and allowing the cross-coupled AOI gate and NOR gate to latch the data in response to a second edge of the first clock;
operating a second latch in a transparent mode by enabling an OR-AND-Inverter (OAI) gate to receive the data from the first latch and apply the inverted data to an input of a NAND gate cross-coupled with the OAI gate in response to a first edge of a second clock; and
operating the second latch in an opaque mode by disabling an OR portion of the OAI gate and allowing the cross-coupled OAI gate and NAND gate to latch the data in response to a second edge of the second clock.

* * * * *